US008232473B2

(12) United States Patent
Smith et al.

(10) Patent No.: US 8,232,473 B2

(45) Date of Patent: Jul. 31, 2012

(54) TANK ASSEMBLY FOR 1 PHASE PADMOUNT TRANSFORMER THAT PREVENTS PAD OPENINGS

(75) Inventors: Richard James Smith, Waukesha, WI (US); Wayne William Lien, Laurel, MS (US)

(73) Assignee: Cooper Technologies Company, Houston, TX (US)

( * ) Notice: Subject to any disclaimer, the term of this patent is extended or adjusted under 35 U.S.C. 154(b) by 397 days.

(21) Appl. No.: 12/470,186

(22) Filed: May 21, 2009

(65) Prior Publication Data

US 2010/0294540 A1 Nov. 25, 2010

(51) Int. Cl.
*H05K 5/00* (2006.01)

(52) U.S. Cl. .................. 174/17 LF; 174/50; 312/223.1; 312/223.2; 312/351.7

(58) Field of Classification Search ............. 174/17 LF, 174/50; 312/223.1, 223.2, 351.7
See application file for complete search history.

(56) References Cited

U.S. PATENT DOCUMENTS 3,014,158 A * 12/1961 Nelson et al. .................. 361/41
4,533,786 A 8/1985 Borgmeyer et al.
4,883,918 A * 11/1989 Browning ......................... 174/1
4,946,725 A * 8/1990 Harlan ............................ 428/73
5,527,988 A 6/1996 Hernandez et al.
5,573,319 A * 11/1996 Dirk ............................. 312/100
5,686,696 A * 11/1997 Baker et al. ..................... 174/50
5,831,212 A * 11/1998 Whitehead et al. ............. 174/50
5,889,231 A * 3/1999 Marusinec et al. ............. 174/50
6,114,624 A * 9/2000 Ghafourian et al. ............ 174/50
6,667,438 B2 12/2003 Schneider et al.
6,670,879 B2 12/2003 Carter et al.
7,365,625 B2 4/2008 Carrasco-Aguirre
2002/0135983 A1* 9/2002 Freitas et al. ................ 361/704
2005/0092009 A1* 5/2005 Thurman ........................ 62/289
2007/0102180 A1 5/2007 Brosig-Rodriguez et al.

* cited by examiner

*Primary Examiner* — Hung S Bui
*Assistant Examiner* — James Wu
(74) *Attorney, Agent, or Firm* — King & Spalding LLP

(57) ABSTRACT

A tank, mountable to an opening formed within a mounting pad, includes a front plate, at least one sidewall panel, a pedestal base, and a cover. The at least one sidewall panel is coupled to the front plate to form the tank sides. The pedestal base is coupled to the front plate and a lower portion of the sidewall panels. The cover is coupled to the upper portions of the sidewall panels. The sidewall panels are configured into a first shape which forms a gap between the opening and at least one of the sidewall panels when the sidewall panel lower portions are positioned adjacently above the opening. The pedestal base is configured into a second shape where the outer profile of the coupled pedestal base and the front plate completely covers the opening when disposed over the opening. The tank encloses an electrical device and a dielectric fluid.

21 Claims, 6 Drawing Sheets

TANK ASSEMBLY FOR 1 PHASE PADMOUNT TRANSFORMER THAT PREVENTS PAD OPENINGS

TECHNICAL FIELD

The present invention relates generally to an electrical device immersed in a fluid, such as a transformer, and more particularly, to a tank structure that contain the immersed electrical device.

BACKGROUND

Electrical apparatuses, such as transformers, are typically immersed in a fluid to ensure their electrical isolation and/or to assist in heat dissipation or refrigeration of the electrical apparatus. A tank contains the electrical apparatus, which is immersed in a fluid. Some fluids used to immerse these electrical apparatuses include dielectric fluids, such as oil, which assist in transferring heat generated from the electrical apparatus to the inner walls of the tank. The heat is subsequently released to the surrounding atmosphere.

Conventional tanks are formed in the shape of a rectangular enclosure and have four vertical side walls, a horizontal top wall or cover, and a horizontal bottom wall or base. During assembly, five of those walls are preassembled together by welding, leaving an opening to subsequently insert the electrical apparatus and the fluid. Typically, the opening is provided at the top of the tank, however, the opening can be provided at one of the tank side walls.

Once the open structure has been leak tested, the electrical apparatus and fluid are placed within the tank through the opening at the top of the tank. The cover is then welded to the upper edges of the four vertical side walls. The tank is then coated with a corrosion resistant film.

These conventional tanks are typically mounted to a mounting pad and disposed over a rectangular opening formed within the mounting pad. The conventional tanks are rectangularly-shaped so that the tank, once placed over the mounting pad opening, conceals the rectangular opening of the mounting pad, thereby preventing gaps formed between the mounting pad opening and the tank. The mounting pad opening must be completely covered. One reason for completely covering the mounting pad opening is to prevent bees, snakes, and other critters from entering the openings and creating certain hazardous conditions for maintenance personnel.

For certain types of electrical apparatuses, such as transformers, the depth, width, and length of the tank are determined by the free electrical and mechanical space that is necessary between the internal surface of the tank walls and the external surface of the electrical apparatus immersed within the tank. Since these minimal distances are often overestimated, the internal volume of the tank becomes very large which thereby increases the quantity of fluid that is used within the tank. Additionally, the fluid occupying the corners of the rectangularly-shaped tank do not provide any operational benefit, thereby unnecessarily increasing the quantity of fluid that is used in the tank. As previously mentioned, the tank is rectangularly-shaped so that the tank conceals the rectangularly-shaped mounting pad opening once disposed over it. As a result of using increased quantities of fluid, the weight of the tank is unnecessarily increased. This unnecessary weight increase of the tank requires that support members be provided to the tank to prevent the deformation of the side walls and the base. The increased quantity of fluid used within the tank, the increased material used to fabricate a larger tank, and the use of support members all contribute to the unnecessary increased costs associated with the manufacturing and the operation of these tanks.

Additionally, once the tank has been disposed over the mounting pad opening, the base of the conventional tank is positioned at or very close to the top surface of the mounting pad. As a result, there is a risk of the base and the lower portions of the side walls becoming corroded due to contact with water and/or other corrosive elements resting on the top surface of the mounting pad to which these conventional tanks are mounted. If the corrosion of the tank is not detected at an early stage, there is a risk of the tank developing leaks through the base and the lower portions of the side walls.

Therefore it is desirable to minimize or eliminate one or more concerns of the types discussed above and to otherwise improve these tanks.

SUMMARY

In an exemplary embodiment, a tank, mountable to an opening formed within a mounting pad, includes a front plate, at least one sidewall panel, a pedestal base, and a cover. A first edge of at least one sidewall panel and a second edge of at least one side wall panel are coupled to the front plate. The pedestal base is coupled to the front plate and the lower portions of the at least one sidewall panel. The cover is coupled to the upper portions of the at least one sidewall panel. The at least one sidewall panel is configured into a first shape which forms a gap between the opening and at least one sidewall panel when the lower portions of the at least one sidewall panel are positioned adjacently on top of the opening of the mounting pad. The pedestal base is configured into a second shape where the outer profile of the coupled pedestal base and the front plate completely covers the opening of the mounting pad when disposed over the opening.

In another exemplary embodiment, a pad mounted tank assembly unit includes a mounting pad and a tank. The mounting pad includes an opening. The tank includes a front plate, at least one sidewall panel, a pedestal base, and a cover. A first edge of at least one sidewall panel and a second edge of at least one side wall panel are coupled to the front plate. The pedestal base is coupled to the front plate and the lower portions of the at least one sidewall panel. The cover is coupled to the upper portions of the at least one sidewall panel. The at least one sidewall panel is configured into a first shape which forms a gap between the opening and at least one of the sidewall panel when the lower portions of the at least one sidewall panel are positioned adjacently on top of the opening of the mounting pad. The pedestal base is configured into a second shape where the outer profile of the coupled pedestal base and the front plate completely covers the opening of the mounting pad when disposed over the opening.

In another exemplary embodiment, a pedestal base includes a base panel, a first side panel, a second side panel, and a rear panel. The base panel includes a first latitudinal edge, a first longitudinal edge, a second latitudinal edge, and a second longitudinal edge. The first side panel is coupled to the first longitudinal edge and extends substantially perpendicular to the base panel. The second side panel is coupled to the second longitudinal edge and also extends substantially perpendicular to the base panel. A surface of the first side panel is configured to face a surface of the second side panel. The rear panel is coupled to the first latitudinal edge and extends substantially perpendicular to the base panel. The base panel's outer profile is configured to completely cover an opening formed within a mounting pad when disposed over the opening.

BRIEF DESCRIPTION OF THE DRAWINGS

The foregoing and other features and aspects of the invention may be best understood with reference to the following description of certain exemplary embodiments, when read in conjunction with the accompanying drawings, wherein.

Figure 1:
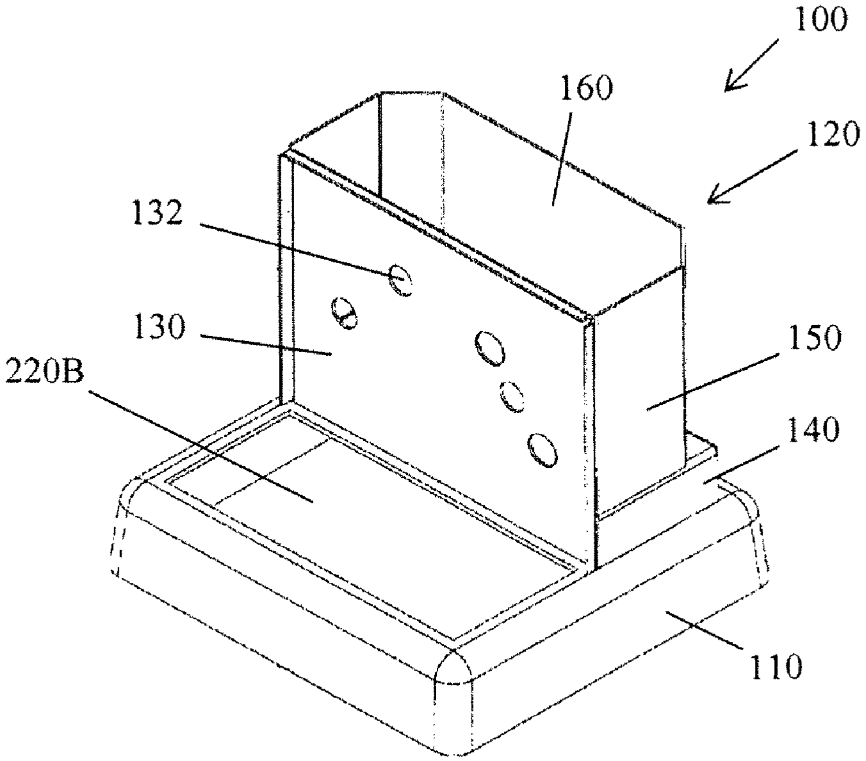
FIG. 1 is a perspective view of a pad mounted tank assembly unit in accordance with an exemplary embodiment.

The drawings illustrate only exemplary embodiments of the invention and are therefore not to be considered limiting of its scope, as the invention may admit to other equally effective embodiments.

BRIEF DESCRIPTION OF EXEMPLARY EMBODIMENTS

The present invention is directed to an enclosure for electrical devices immersed in a fluid, such as a transformer. In particular, the application is directed to a tank structure that contains the immersed electrical device. Although the description of exemplary embodiments is provided below in conjunction with a one-phase pad transformer, alternate embodiments of the invention may be applicable to other types of electronic devices including, but not limited to, pad switchgears, pad regulators, and three-phase pad transformers.

The invention may be better understood by reading the following description of non-limiting, exemplary embodiments with reference to the attached drawings, wherein like parts of each of the figures are identified by like reference characters, and which are briefly described as follows.

As used in this application, the term "coupled" is defined as the bringing of one object next to or adjacent another object and includes, but is not limited to, the terms attached, welded, connected, fastened, affixed, and any other term known to a person of ordinary skill in the art that involves the assembling of two or more panels to one another.

Figure 2:
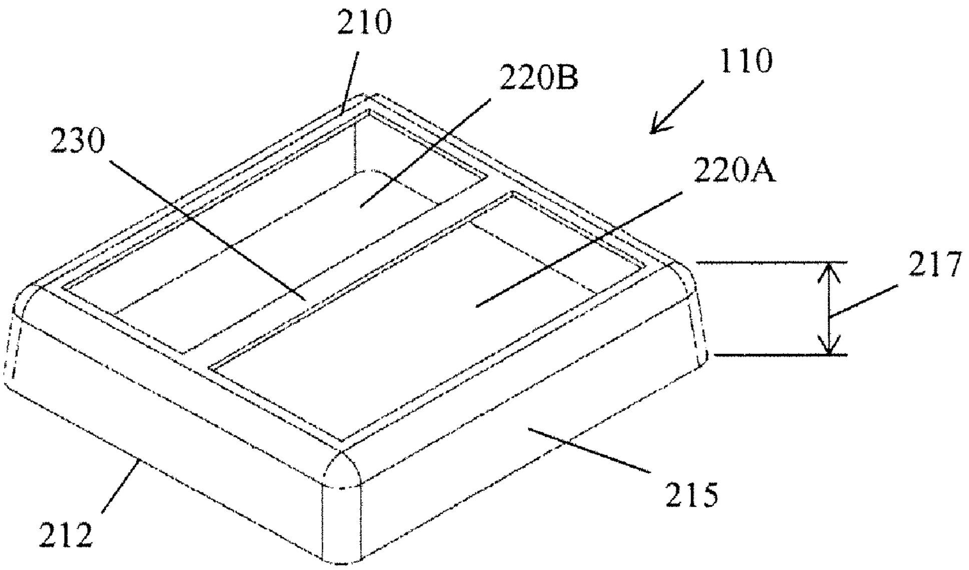
FIG. 2 is a perspective view of a mounting pad of FIG. 1 having one or more openings in accordance with an exemplary embodiment.

FIG. 1 is a perspective view of a pad mounted tank assembly unit 100 in accordance with an exemplary embodiment. Referring to FIG. 1, the pad mounted tank assembly unit 100 includes a mounting pad 110 and a tank assembly unit 120 coupled to the mounting pad 110. According to one exemplary embodiment, the tank assembly unit 120 is disposed over an opening 220A (shown in FIG. 2) formed within the mounting pad 110. The tank assembly unit 120 is configured to completely cover the opening 220A (FIG. 2) of the mounting pad 110 so that no gaps are formed between the tank assembly unit 120 and the opening 220A (FIG. 2). The tank assembly unit 120 includes a front plate 130, a pedestal base 140, a sidewall wrap 150, and a cover (not shown). The front plate 130, the pedestal base 140, the sidewall wrap 150, and the cover are coupled together and configured to form a chamber 160 within the tank assembly unit 120. The pedestal base 140 is coupled to the lower portions of the sidewall wrap 150, and the cover is coupled to the upper portions of the sidewall wrap 150. The sidewall wrap 150 is configured into a first shape that forms a gap between the opening 220A and at least a portion of the sidewall wrap 150 when the lower portions of the sidewall wrap 150 are positioned adjacently on top of the opening 220A. The pedestal base 140 is configured into a second shape where the outer profile of the coupled pedestal base 140 and the front plate 130 completely covers the opening 220A when the pedestal base 140 is disposed over the opening 220A.

The tank assembly unit 120 is configured to safely house a one phase transformer unit (not shown) within the chamber 160. However, the tank assembly unit 120 can be adapted to safely house other transformer types and/or other electrical devices without departing from the scope and spirit of the exemplary embodiment. According to FIG. 1, the cross-sectional view of the tank assembly unit 120 from above the tank assembly unit 120 is non-rectangular and is formed of more than four sides. Although one exemplary embodiment of the tank assembly unit 120 is described below, alternative shapes for the tank assembly unit 120 are possible, including, but not limited to, a tank assembly unit having rounded sides and/or rounded corners, without departing from the scope and spirit of the exemplary embodiment.

As shown in FIG. 1, the front plate 130, the pedestal base 140, and the sidewall wrap 150 are coupled to one another to form leak-resistant couplings between these individual components. According to one example, the front plate 130, the pedestal base 140, and the sidewall wrap 150 are welded to one another along a portion of their edges. According to one exemplary embodiment, one or more welds are visible from the exterior of the tank assembly unit 120 to provide early detection of possible leaks. However, alternate leak-resistant couplings, known to persons of ordinary skill in the art, can be used without departing from the scope and spirit of the exemplary embodiment. The components and assembly of the tank assembly unit 120 are described in further detail below with respect to the description provided for FIGS. 3-5.

Once the tank assembly unit 120 has been assembled, a transformer (not shown) and/or other electrical device, is mounted within the chamber 160 according to means and methods known to persons of ordinary skill in the art. A dielectric fluid (not shown), such as oil, is placed within at least a portion of the chamber 160 containing the transformer in an amount sufficient to provide appropriate heat transfer from the exterior surface of the transformer to the inner walls of the tank assembly unit 120. The appropriate amount of dielectric fluid is dependent upon the size of the transformer, the heat conductivity of the dielectric fluid, and the material of the tank assembly unit 120.

In order to improve the rate of heat transfer from the transformer, fins (not shown) can be provided within the tank assembly unit 120 to increase the surface area of the tank assembly unit 120 that is available to provide cooling. Alternatively, or in addition to the fins, other heat transfer enhancing means can be used, including, but not limited to, radiators or tubes for circulating the dielectric fluid within the tank assembly unit 120, fans for forcing a fluid, such as air, across the tank assembly unit 120 or the radiators, and other forced oil cooling systems, without departing from the scope and spirit of the exemplary embodiment.

One or more through-holes 132 are provided on the front plate 130. These through-holes allow for electrical wirings, tubings, and/or other connectors to be connected from the transformer located within the tank assembly unit 120 to one or more control devices (not shown) and/or indicators positioned adjacent to or near the through-holes 132 at the exterior side of the tank assembly unit 120. A cabinet (not shown) or other structure is disposed over an opening 220B (FIG. 2) also formed within the mounting pad 110 and houses the control devices and/or indicators. The cabinet or other structure is configured to completely cover the opening 220B (FIG. 2) of the mounting pad 110 so that no gaps are formed between the cabinet or other structure and the opening 220B (FIG. 2). The cabinet can have one or more doors that open, a hinge that allows the entire cabinet to be rotatably opened, or any other opening means known to persons having ordinary skill in the art that allows access to the control devices and/or indicators.

FIG. 2 is a perspective view of the mounting pad 110 of FIG. 1 having one or more openings 220A and 220B in accordance with an exemplary embodiment. Referring to FIGS. 1 and 2, the mounting pad 110 has a generally square shape having a top surface 210, a bottom surface 212, and four sidewalls 215. However, the shape of the mounting pad 110 can be any geometric shape including, but not limited to, rectangular, circular, and oval. Also, although four sidewalls 215 are illustrated in the exemplary embodiment, alternative embodiments can have greater or fewer sidewalls. In one exemplary embodiment, the sidewalls 215 can have a height 217 ranging from about one-fourth inch to about two feet. However, according to alternative exemplary embodiments, the height 217 can be greater than two feet. The mounting pad 110 is fabricated from any suitable material including, but not limited to, fiberglass, concrete, metals, metal alloys, and polymers.

In the exemplary embodiment, the top surface 210 of the mounting pad 110 has two openings 220A and 220B extending through the mounting pad 110 with a divider 230 separating the two openings 220A and 220B. The two openings 220A and 220B at the top surface 210 have a generally rectangular shape; however, other geometric shapes may be formed including, but not limited to, square, circular, and oval. Also, the number and/or shape of at least one of the openings 220A and 220B at the top surface 210 of the mounting pad 110 can be different in number and/or shape than openings at the bottom surface 212. For example, in the exemplary embodiment, there are two rectangularly-shaped openings 220A and 220B at the top surface 210 of the mounting pad 110, while there is one square-shaped opening at the bottom surface 212 of the mounting pad 110. Although two openings 220A and 220B are formed at the top surface 210 of the mounting pad 110, greater or fewer openings can be formed at the top surface 210 without departing from the scope and spirit of the exemplary embodiment. Similarly, although one opening is formed at the bottom surface 212 of the mounting pad 110, more openings can be formed at the bottom surface 212 of the mounting pad 110 without departing from the scope and spirit of the exemplary embodiment. Additionally, the opening 220A and 220B can each be a different shape and/or a different size than the other opening 220A and 220B.

The upper surface of the divider 230 is substantially in the same plane as the top surface 210 of the mounting pad 110, while the bottom surface of the divider 230 is positioned above the plane formed by the bottom surface 212 of the mounting pad 110. However, in certain alternative exemplary embodiments, the upper surface of the divider 230 is raised above or lowered below the plane formed by the top surface 210 of the mounting pad 110. Similarly, in certain exemplary embodiments, the divider 230 can extend a distance such that the bottom surface of the divider 230 is substantially in the same plane as the bottom surface 212 of the mounting pad 110. Alternative configurations and shapes of the mounting pad 110 are considered to be within the scope and spirit of the exemplary embodiment.

Figure 3A:
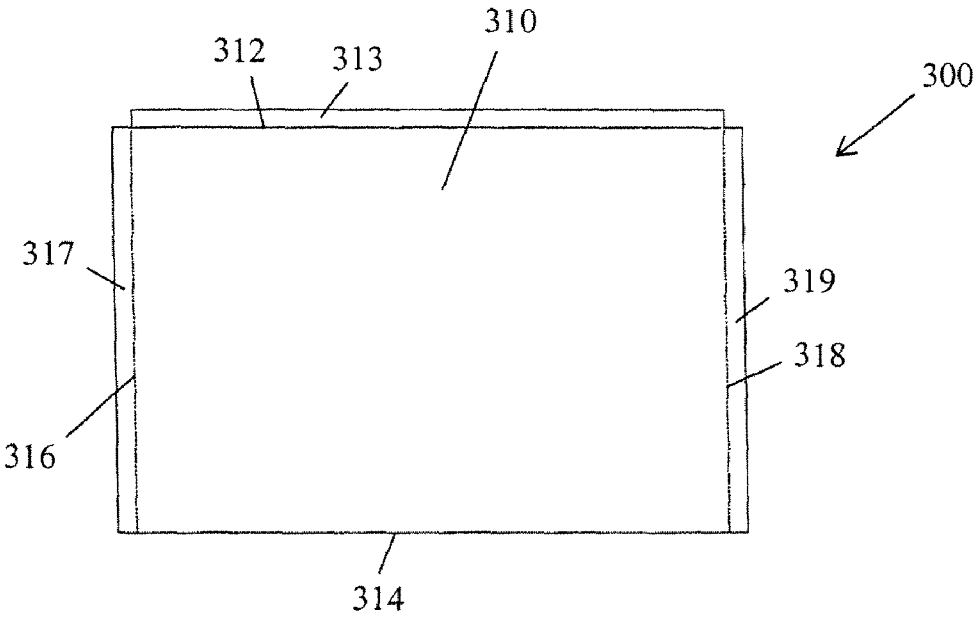
FIG. 3A is a side view of a front plate sheet metal used to fabricate a front plate of FIG. 1 in accordance with an exemplary embodiment.
Figure 3B:
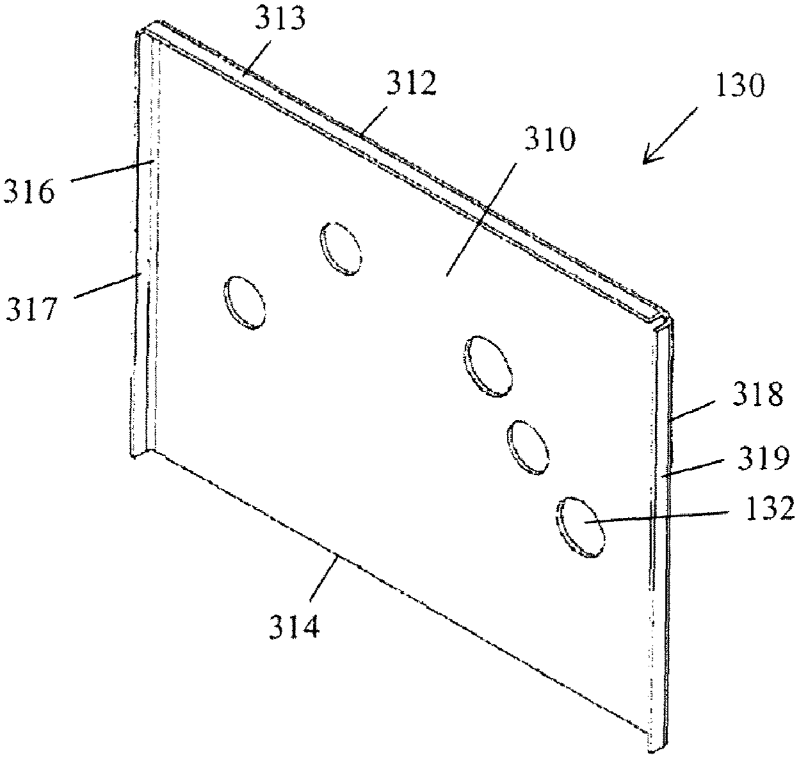
FIG. 3B is a perspective view of the front plate fabricated from the front plate sheet of FIG. 3A in accordance with an exemplary embodiment.

FIG. 3A is a side view of a front plate sheet metal 300 used to fabricate the front plate 130 of FIG. 1 in accordance with an exemplary embodiment. FIG. 3B is a perspective view of the front plate 130 fabricated from the front plate sheet 300 of FIG. 3A in accordance with an exemplary embodiment. Referring to FIGS. 1, 3A, and 3B, the front plate sheet metal 300 includes a front plate panel 310. Additionally, according to some exemplary embodiments, the front plate sheet metal 300 also includes a first flange 313, a second flange 317, and a third flange 319. However, according to certain alternative exemplary embodiments, the number of flanges can be greater or fewer without departing from the scope and spirit of the exemplary embodiment.

The front plate panel 310 has a first latitudinal edge 312, a second latitudinal edge 314, a first longitudinal edge 316, and a second longitudinal edge 318. According to this exemplary embodiment, the length of the first latitudinal edge 312 is substantially equal to the length of the second latitudinal edge 314. Similarly, the length of the first longitudinal edge 316 is substantially equal to the length of the second longitudinal edge 318. However, in alternative exemplary embodiments, the lengths of the first latitudinal edge 312 and the second latitudinal edge 314 and/or the lengths of the first longitudinal edge 316 and the second longitudinal edge 318 can be different from one another. According to one exemplary embodiment, the lengths of the first latitudinal edge 312 and the second latitudinal edge 314 are about thirty-three inches and the lengths of the first longitudinal edge 316 and the second longitudinal edge 318 are about twenty-four inches. However, according to other exemplary embodiments, the lengths of the first latitudinal edge 312 and the second latitudinal edge 314 can be greater than or less than thirty-three inches, depending upon the requirements of the application, without departing from the scope and spirit of the exemplary embodiment. For example, the lengths of the first latitudinal edge 312 and the second latitudinal edge 314 can range from about six inches to about twelve feet. Similarly, according to other exemplary embodiments, the lengths of the first longitudinal edge 316 and the second longitudinal edge 318 can be greater than or less than twenty-four inches, depending upon the requirements of the application, without departing from the scope and spirit of the exemplary embodiment. For example, the lengths of the first longitudinal edge 316 and the second longitudinal edge 318 can range from about six inches to about twelve feet.

The first flange 313 extends away from the first latitudinal edge 312 in substantially the same plane as the front plate panel 310. The first flange 313 is integrally formed with the front plate panel 310 substantially along the entire length of the first latitudinal edge 312. However, according to some alternative exemplary embodiments, the first flange 313 is independently formed from the front plate panel 310 and thereafter coupled to the first latitudinal edge 312 of the front plate panel 310. According to one exemplary embodiment, the first flange 313 extends a distance of about one inch away from the first latitudinal edge 312. However, according to other exemplary embodiments, the first flange 313 extends greater than or less than one inch away from the first latitudinal edge 312 without departing from the scope and spirit of the exemplary embodiment. For example, the first flange 313 can extend a distance ranging from about one-fourth inch to about six inches away from the first latitudinal edge 312.

Similarly, the second flange 317 extends away from the first longitudinal edge 316 in substantially the same plane as the front plate panel 310. The second flange 317 is integrally formed with the front plate panel 310 substantially along the entire length of the first longitudinal edge 316. However, according to some alternative exemplary embodiments, the second flange 317 is independently formed from the front plate panel 310 and thereafter coupled to the first longitudinal edge 316 of the front plate panel 310. According to one exemplary embodiment, the second flange 317 extends a distance of about one inch away from the first longitudinal edge 316. However, according to other exemplary embodiments, the second flange 317 extends greater than or less than one inch away from the first longitudinal edge 316 without departing from the scope and spirit of the exemplary embodiment. For example, the second flange 317 can extend a distance ranging from about one-fourth inch to about six inches away from the first longitudinal edge 316.

Similarly, the third flange 319 extends away from the second longitudinal edge 318 in substantially the same plane as the front plate panel 310. The third flange 319 is integrally formed with the front plate panel 310 substantially along the entire length of the second longitudinal edge 318. However, according to some alternative exemplary embodiments, the third flange 319 is independently formed from the front plate panel 310 and thereafter coupled to the second longitudinal edge 319 of the front plate panel 310. According to one exemplary embodiment, the third flange 319 extends a distance of about one inch away from the second longitudinal edge 318. However, according to other exemplary embodiments, the third flange 319 extends greater than or less than one inch away from the second longitudinal edge 318 without departing from the scope and spirit of the exemplary embodiment. For example, the third flange 319 can extend a distance ranging from about one-fourth inch to about six inches away from the second longitudinal edge 318.

Although the second latitudinal edge 314 does not have a corresponding flange in this exemplary embodiment, the second latitudinal flange 314 can have a corresponding flange without departing from the scope and spirit of the exemplary embodiment.

According to this exemplary embodiment, the front plate sheet metal 300 is fabricated from any suitable material including, but not limited to, mild steels, stainless steels, metals, alloys, and polymers. The thickness of the material is about twelve gauge; however, the thickness of the material can be greater than or less than twelve gauge depending upon at least the weight of the tank assembly unit 120 once the transformer and dielectric fluid is placed within it and the material chosen to fabricate the tank assembly unit 120. Exemplary thicknesses of the front plate sheet metal 300 ranges from about sixteen gauge to about ten gauge; however, other thicknesses can be used to fabricate the front plate sheet metal 300.

To form the front plate 130, the first flange 313, the second flange 317, and the third flange 319 are bent about ninety degrees in the same direction with respect to the front plate panel 310 such that the first flange 313, the second flange 317, and the third flange 319 all extend in the same direction. This bending of the first flange 313, the second flange 317, and the third flange 319 result in the first flange 313, the second flange 317, and the third flange 319 being substantially perpendicular to the front plate panel 310. The second flange 317 and the third flange 319 provide support for the front plate 130. The first flange 313 provides a support structure for the cover (not shown) once it is coupled to the front plate 130. Additionally, one or more through-holes 132 are formed on the front plate 130. These through-holes 132 allow for electrical wirings, tubings, and/or other connectors to be connected from the transformer located within the tank assembly unit 120 to one or more control devices (not shown) and/or indicators positioned adjacent to or near the through-holes 132 at the exterior side of the tank assembly unit 120. According to this exemplary embodiment, five through-holes 132 are formed within the front plate 130; however, in alternate embodiments, greater or fewer through-holes can be formed in the front plate 130 without departing from the scope and spirit of the exemplary embodiment.

Figure 4A:
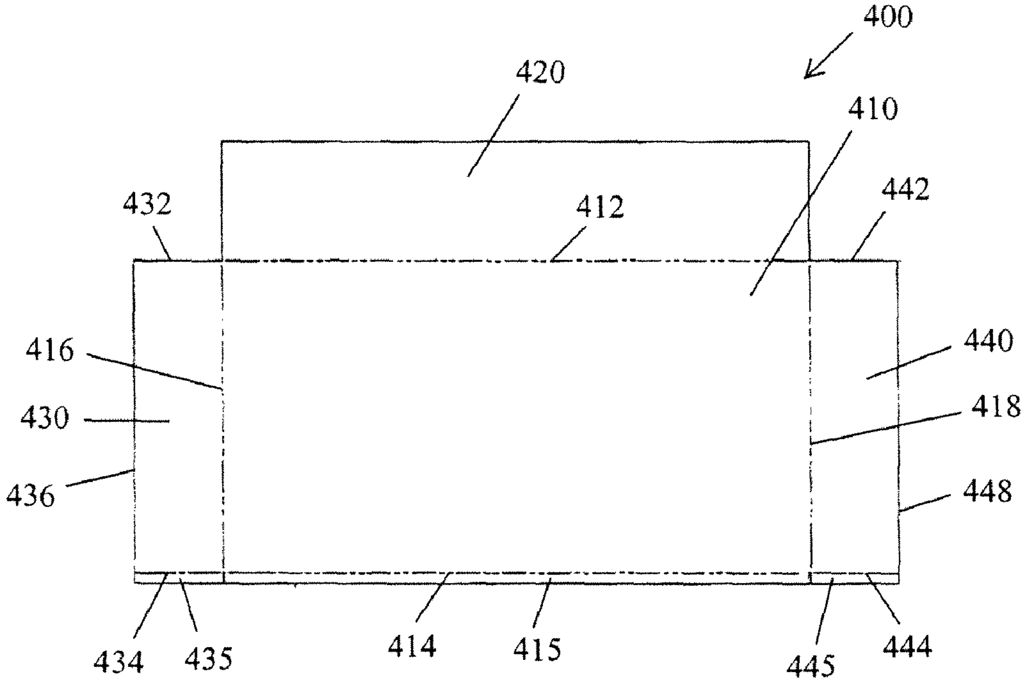
FIG. 4A is a side view of a pedestal base sheet metal used to fabricate a pedestal base of FIG. 1 in accordance with an exemplary embodiment.
Figure 4B:
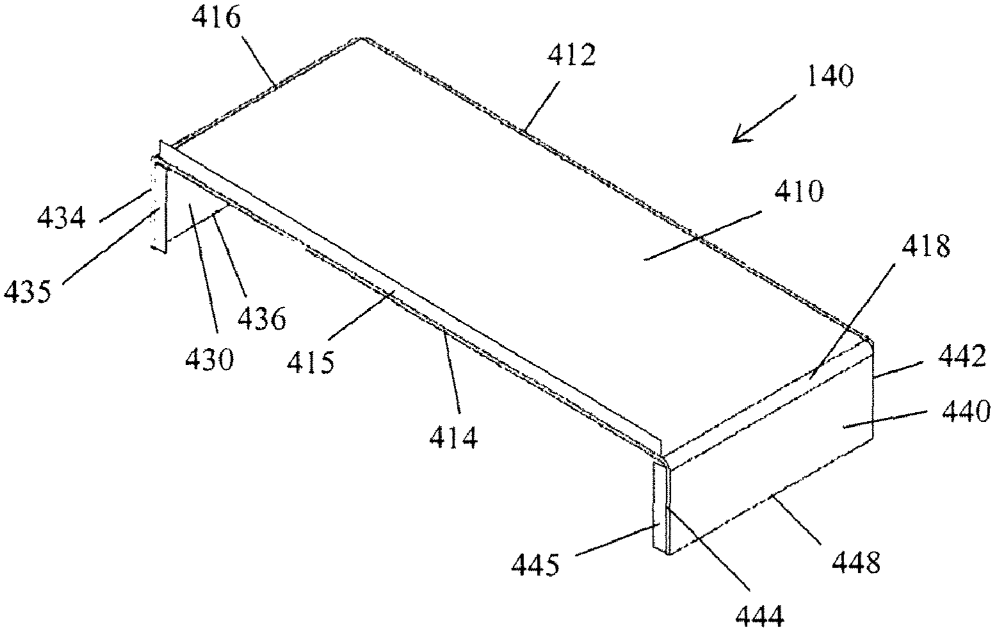
FIG. 4B is a perspective view of the pedestal base fabricated from the pedestal base sheet metal of FIG. 4A in accordance with an exemplary embodiment.

FIG. 4A is a side view of a pedestal base sheet metal 400 used to fabricate the pedestal base 140 of FIG. 1 in accordance with an exemplary embodiment. FIG. 4B is a perspective view of the pedestal base 140 fabricated from the pedestal base sheet metal 400 of FIG. 4A in accordance with an exemplary embodiment. Referring to FIGS. 1, 4A, and 4B, the pedestal base sheet metal 400 includes a pedestal base panel 410, a rear side panel 420, a first side panel 430, and a second side panel 440. Additionally, according to some exemplary embodiments, the pedestal base sheet metal 400 also includes a first flange 415, a second flange 435, and a third flange 445. However, according to certain alternative exemplary embodiments, the number of flanges can be greater or fewer without departing from the scope and spirit of the exemplary embodiment. In certain other alternative exemplary embodiments, the pedestal base sheet metal 400 also includes a front side panel (not shown). Yet, in another exemplary embodiment, the pedestal base sheet metal 400 includes only the pedestal base panel 410 with optional flanges extending from one or more of its sides.

The pedestal base panel 410 has a first latitudinal edge 412, a second latitudinal edge 414, a first longitudinal edge 416, and a second longitudinal edge 418. According to this exemplary embodiment, the length of the first latitudinal edge 412 is substantially equal to the length of the second latitudinal edge 414. Similarly, the length of the first longitudinal edge 416 is substantially equal to the length of the second longitudinal edge 418. However, in alternative exemplary embodiments, the lengths of the first latitudinal edge 412 and the second latitudinal edge 414 and/or the lengths of the first longitudinal edge 416 and the second longitudinal edge 418 can be different from one another. According to one exemplary embodiment, the lengths of the first latitudinal edge 412 and the second latitudinal edge 414 are about thirty-three inches and the lengths of the first longitudinal edge 416 and the second longitudinal edge 418 are about thirteen inches. However, according to other exemplary embodiments, the lengths of the first latitudinal edge 412 and the second latitudinal edge 414 can be greater than or less than thirty-three inches, depending upon the requirements of the application, without departing from the scope and spirit of the exemplary embodiment. For example, the lengths of the first latitudinal edge 412 and the second latitudinal edge 414 can range from about six inches to about twelve feet. According to some exemplary embodiments, the lengths of the first latitudinal edge 412 and the second latitudinal edge are substantially similar to the lengths of the first latitudinal edge 312 and the second latitudinal edge 314 of the front plate panel 310. Similarly, according to other exemplary embodiments, the lengths of the first longitudinal edge 316 and the second longitudinal edge 318 can be greater than or less than thirteen inches, depending upon the requirements of the application, without departing from the scope and spirit of the exemplary embodiment. For example, the lengths of the first longitudinal edge 416 and the second longitudinal edge 418 can range from about six inches to about twelve feet. Although various dimensions can be used for the lengths of the first latitudinal edge 412, the second latitudinal edge 414, the first longitudinal edge 416, and the second longitudinal edge 418, these lengths are configured to be sufficient to conceal the opening 220A of the mounting pad 110 once the pedestal base 140 is disposed over the opening 220A.

The first flange 415 extends away from the second latitudinal edge 414 in substantially the same plane as the pedestal base panel 410. The first flange 415 is integrally formed with the pedestal base panel 410 substantially along the entire length of the second latitudinal edge 414. However, according to some alternative exemplary embodiments, the first flange 415 is independently formed from the pedestal base panel 410 and thereafter coupled to the second latitudinal edge 414 of the pedestal base panel 410. According to one exemplary embodiment, the first flange 415 extends a distance of about one-half inch away from the second latitudinal edge 414. However, according to other exemplary embodiments, the first flange 415 extends greater than or less than one-half inch away from the second latitudinal edge 414 without departing from the scope and spirit of the exemplary embodiment. For example, the first flange 415 can extend a distance ranging from about one-fourth inch to about six inches away from the second latitudinal edge 414.

The rear side panel 420 extends away from the first latitudinal edge 412 in substantially the same plane as the pedestal base panel 410. The rear side panel 420 is integrally formed with the pedestal base panel 410 substantially along the entire length of the first latitudinal edge 412. However, according to some alternative exemplary embodiments, the rear side panel 420 is independently formed from the pedestal base panel 410 and thereafter coupled to the first latitudinal edge 412 of the pedestal base panel 410. According to one exemplary embodiment, the rear side panel 420 extends a distance of about five inches away from the first latitudinal edge 412. However, according to other exemplary embodiments, the rear side panel 420 extends greater than or less than five inches away from the first latitudinal edge 412 without departing from the scope and spirit of the exemplary embodiment. For example, the rear side panel 420 can extend a distance ranging from about one-fourth inch to about twelve inches away from the first latitudinal edge 412. The rear side panel 420 determines the height of the pedestal base 140. Although no flanges are coupled to the sides of the rear side panel 420, flanges can be coupled to one or more sides without departing from the scope and spirit of the exemplary embodiment.

The first side panel 430 extends away from the first longitudinal edge 416 in substantially the same plane as the pedestal base panel 410. The first side panel 430 is integrally formed with the pedestal base panel 410 substantially along the entire length of the first longitudinal edge 416. However, according to some alternative exemplary embodiments, the first side panel 430 is independently formed from the pedestal base panel 410 and thereafter coupled to the first longitudinal edge 416 of the pedestal base panel 410.

The first side panel 430 has a first latitudinal edge 432, a second latitudinal edge 434, a first longitudinal edge 436, and the commonly shared first longitudinal edge 416 of the pedestal base panel 410. According to this exemplary embodiment, the length of the first latitudinal edge 432 is substantially equal to the length of the second latitudinal edge 434. Similarly, the length of the first longitudinal edge 436 is substantially equal to the length of the commonly shared first longitudinal edge 416 of the pedestal base panel 410. However, in alternative exemplary embodiments, the lengths of the first latitudinal edge 432 and the second latitudinal edge 434 and/or the lengths of the first longitudinal edge 436 and the commonly shared first longitudinal edge 416 of the pedestal base panel 410 can be different from one another. According to one exemplary embodiment, the lengths of the first latitudinal edge 432 and the second latitudinal edge 434 are about five inches and the lengths of the first longitudinal edge 436 and the commonly shared first longitudinal edge 416 of the pedestal base panel 410 are about thirteen inches. However, according to other exemplary embodiments, the lengths of the first latitudinal edge 432 and the second latitudinal edge 434 can be greater than or less than five inches without departing from the scope and spirit of the exemplary embodiment. For example, the first side panel 430 can extend a distance ranging from about one-fourth inch to about twelve inches away from the first longitudinal edge 416 of the pedestal base panel 410. The lengths of the first latitudinal edge 432 and the second latitudinal edge 434 of the first side panel 430 determines the height of the pedestal base 140.

The second flange 435 extends away from the second latitudinal edge 434 in substantially the same plane as the first side panel 430. The second flange 435 is integrally formed with the first side panel 430 substantially along the entire length of the second latitudinal edge 434. However, according to some alternative exemplary embodiments, the second flange 435 is independently formed from the first side panel 430 and thereafter coupled to the second latitudinal edge 434 of the first side panel 430. According to one exemplary embodiment, the second flange 435 extends a distance of about one-half inch away from the second latitudinal edge 434. However, according to other exemplary embodiments, the second flange 435 extends greater than or less than one-half inch away from the second latitudinal edge 434 without departing from the scope and spirit of the exemplary embodiment. For example, the second flange 435 can extend a distance ranging from about one-fourth inch to about six inches away from the second latitudinal edge 434. Although the first latitudinal edge 432 and the first longitudinal edge 436 do not have a corresponding flange in this exemplary embodiment, one or both of the first latitudinal edge 432 and the first longitudinal edge 436 can have a corresponding flange without departing from the scope and spirit of the exemplary embodiment.

The second side panel 440 extends away from the second longitudinal edge 418 in substantially the same plane as the pedestal base panel 410. The second side panel 440 is integrally formed with the pedestal base panel 410 substantially along the entire length of the second longitudinal edge 418. However, according to some alternative exemplary embodiments, the second side panel 440 is independently formed from the pedestal base panel 410 and thereafter coupled to the second longitudinal edge 418 of the pedestal base panel 410.

The second side panel 440 has a first latitudinal edge 442, a second latitudinal edge 444, the commonly shared second longitudinal edge 418 of the pedestal base panel 410, and a second longitudinal edge 448. According to this exemplary embodiment, the length of the first latitudinal edge 442 is substantially equal to the length of the second latitudinal edge 444. Similarly, the length of the second longitudinal edge 448 is substantially equal to the length of the commonly shared second longitudinal edge 418 of the pedestal base panel 410. However, in alternative exemplary embodiments, the lengths of the first latitudinal edge 442 and the second latitudinal edge 444 and/or the lengths of the second longitudinal edge 448 and the commonly shared second longitudinal edge 418 of the pedestal base panel 410 can be different from one another. According to one exemplary embodiment, the lengths of the first latitudinal edge 442 and the second latitudinal edge 444 are about five inches and the lengths of the second longitudinal edge 448 and the commonly shared second longitudinal edge 418 of the pedestal base panel 410 are about thirteen inches. However, according to other exemplary embodiments, the lengths of the first latitudinal edge 442 and the second latitudinal edge 444 can be greater than or less than five inches without departing from the scope and spirit of the exemplary embodiment. For example, the second side panel 440 can extend a distance ranging from about one-fourth inch to about twelve inches away from the second longitudinal edge 418 of the pedestal base panel 410. The lengths of the first latitudinal edge 442 and the second latitudinal edge 444 of the second side panel 440 also determines the height of the pedestal base 140.

The third flange 445 extends away from the second latitudinal edge 444 in substantially the same plane as the second side panel 440. The third flange 445 is integrally formed with the second side panel 440 substantially along the entire length of the second latitudinal edge 444. However, according to some alternative exemplary embodiments, the third flange 445 is independently formed from the second side panel 440 and thereafter coupled to the second latitudinal edge 444 of the second side panel 440. According to one exemplary embodiment, the third flange 445 extends a distance of about one-half inch away from the second latitudinal edge 444. However, according to other exemplary embodiments, the third flange 445 extends greater than or less than one-half inch away from the second latitudinal edge 444 without departing from the scope and spirit of the exemplary embodiment. For example, the third flange 445 can extend a distance ranging from about one-fourth inch to about six inches away from the second latitudinal edge 444. Although the first latitudinal edge 442 and the second longitudinal edge 448 do not have a corresponding flange in this exemplary embodiment, one or both of the first latitudinal edge 442 and the second longitudinal edge 448 can have a corresponding flange without departing from the scope and spirit of the exemplary embodiment.

According to this exemplary embodiment, the pedestal base sheet metal 400 is fabricated from any suitable material including, but not limited to, mild steels, stainless steels, metals, alloys, and polymers. The thickness of the material is about twelve gauge; however, the thickness of the material can be greater than or less than twelve gauge depending upon at least the weight of the tank assembly unit 120 once the transformer and dielectric fluid is placed within it and the material chosen to fabricate the tank assembly unit 120. Exemplary thicknesses of the pedestal base sheet metal 400 ranges from about sixteen gauge to about ten gauge; however, other thicknesses can be used to fabricate the pedestal base sheet metal 400.

To form the pedestal base 140, the rear side panel 420, the first side panel 430, and the second side panel 440 are bent about ninety degrees in the same direction with respect to the pedestal base panel 410 such that the rear side panel 420, the first side panel 430, and the second side panel 440 all extend in the same direction. This bending of the rear side panel 420, the first side panel 430, and the second side panel 440 result in the rear side panel 420, the first side panel 430, and the second side panel 440 being substantially perpendicular to the pedestal base panel 410. The second flange 435 and the third flange 445 are bent about ninety degrees with respect to the first side panel 430 and the second side panel 440, respectively, such that both the second flange 435 and the third flange 445 are oriented in a direction towards one another. This bending of the second flange 435 and the third flange 445 result in the second flange 435 and the third flange 445 being substantially perpendicular to the first side panel 430 and the second side panel 440, respectively. The first flange 415 also is bent about ninety degrees with respect to the pedestal base panel 410 and is oriented in a direction that is parallel, but opposite, to the direction of the rear side panel 420. This bending of the first flange 415 results in the first flange 415 being substantially perpendicular to the pedestal base panel 410. The first flange 415, the second flange 435, and the third flange 445 provide support for the pedestal base 140. The first flange 415, the second flange 435, and the third flange 445 are configured to be coupled to the lower portions of the front panel 130 in a leak resistant manner, for example, via welding.

The height of the pedestal base 140 can be increased to decrease the volume of the chamber 160 for a fixed dimension of the tank assembly unit 120. Thus, the longitudinal edges of the sidewall wrap 150 decreases. Alternatively, the height of the pedestal base 140 can be decreased to increase the volume of the chamber 160 for a fixed dimension of the tank assembly unit 120. Thus, the longitudinal edges of the sidewall wrap 150 increases.

Figure 5A:
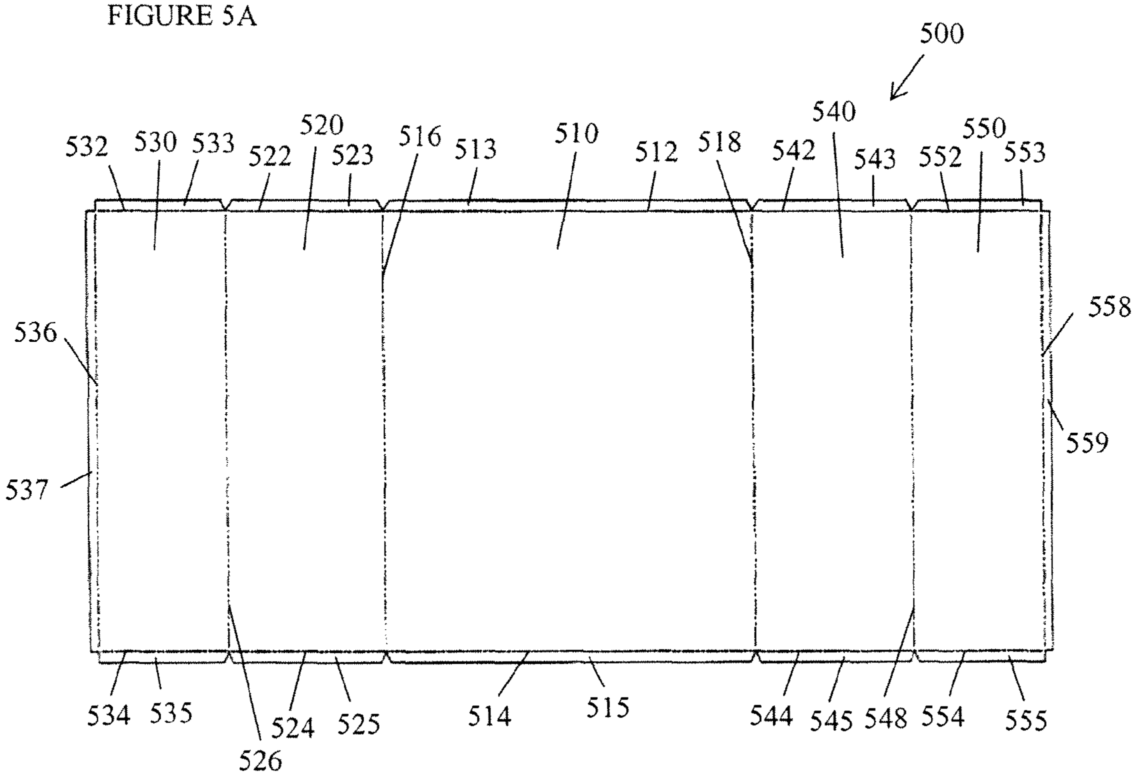
FIG. 5A is a side view of a sidewall wrap metal sheet used to fabricate a sidewall wrap of FIG. 1 in accordance with an exemplary embodiment.
Figure 5B:
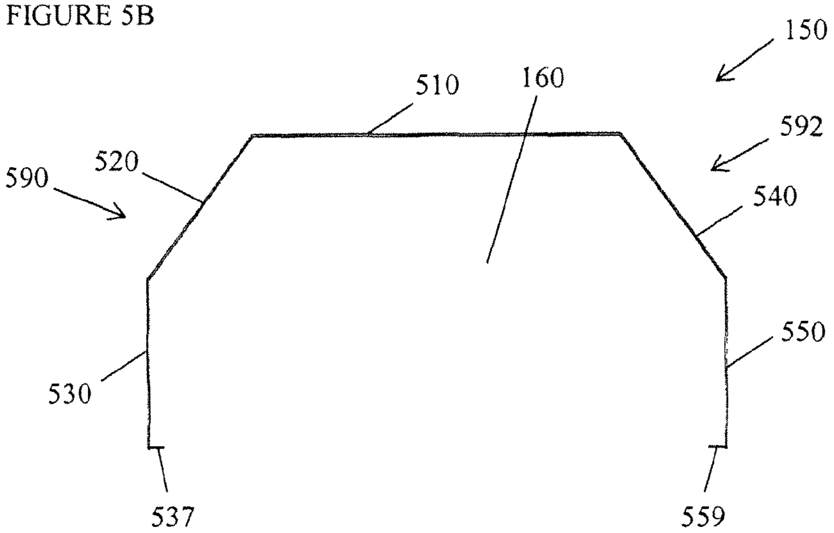
FIG. 5B is a top view of the sidewall wrap fabricated from the sidewall wrap metal sheet of FIG. 5A in accordance with an exemplary embodiment.

FIG. 5A is a side view of a sidewall wrap metal sheet 500 used to fabricate the sidewall wrap 150 of FIG. 1 in accordance with an exemplary embodiment. FIG. 5B is a top view of the sidewall wrap 150 fabricated from the sidewall wrap metal sheet 500 of FIG. 5A in accordance with an exemplary embodiment. Referring to FIGS. 1, 5A, and 5B, the sidewall wrap metal sheet 500 includes five sidewall panels, which are a rear sidewall panel 510, a first sidewall panel 520, a second sidewall panel 530, a third sidewall panel 540, and a fourth sidewall panel 550. Additionally, according to some exemplary embodiments, the sidewall wrap metal sheet 500 also includes a first flange 513, a second flange 515, a third flange 523, a fourth flange 525, a fifth flange 533, a sixth flange 535, a seventh flange 537, an eighth flange 543, a ninth flange 545, a tenth flange 553, an eleventh flange 555, and a twelfth flange 559. However, according to certain alternative exemplary embodiments, the number of flanges can be fewer without departing from the scope and spirit of the exemplary embodiment. In certain other alternative exemplary embodiments, the number of sidewall panels can be greater than or fewer than five without departing from the scope and spirit of the exemplary embodiment. For example, there can be seven sidewall panels for forming a sidewall wrap having inverted corners, as illustrated and described with respect to FIGS. 6A and 6B. Alternatively, other exemplary embodiments can have sidewall wraps configured in various geometric shapes, including but not limited to, sidewall wraps having rounded corners, without departing from the scope and spirit of the exemplary embodiment.

The rear sidewall panel 510 has a first latitudinal edge 512, a second latitudinal edge 514, a first longitudinal edge 516, and a second longitudinal edge 518. According to this exemplary embodiment, the length of the first latitudinal edge 512 is substantially equal to the length of the second latitudinal edge 514. Similarly, the length of the first longitudinal edge 516 is substantially equal to the length of the second longitudinal edge 518. However, in alternative exemplary embodiments, the lengths of the first latitudinal edge 512 and the second latitudinal edge 514 and/or the lengths of the first longitudinal edge 516 and the second longitudinal edge 518 can be different from one another. According to one exemplary embodiment, the lengths of the first latitudinal edge 512 and the second latitudinal edge 514 are about nineteen inches and the lengths of the first longitudinal edge 516 and the second longitudinal edge 518 are about nineteen inches. However, according to other exemplary embodiments, the lengths of the first latitudinal edge 512 and the second latitudinal edge 514 can be greater than or less than nineteen inches, depending upon the requirements of the application, without departing from the scope and spirit of the exemplary embodiment. For example, the lengths of the first latitudinal edge 512 and the second latitudinal edge 514 can range from about six inches to about twelve feet. Similarly, according to other exemplary embodiments, the lengths of the first longitudinal edge 516 and the second longitudinal edge 518 can be greater than or less than nineteen inches, depending upon the requirements of the application, without departing from the scope and spirit of the exemplary embodiment. For example, the lengths of the first longitudinal edge 516 and the second longitudinal edge 518 can range from about six inches to about twelve feet.

The first flange 513 extends away from the first latitudinal edge 512 in substantially the same plane as the rear sidewall panel 510. The first flange 513 is integrally formed with the rear sidewall panel 510 substantially along the entire length of the first latitudinal edge 512. However, according to some alternative exemplary embodiments, the first flange 513 is independently formed from the rear sidewall panel 510 and thereafter coupled to the first latitudinal edge 512 of the rear sidewall panel 510. According to one exemplary embodiment, the first flange 513 extends a distance of about one-half inch away from the first latitudinal edge 512. However, according to other exemplary embodiments, the first flange 513 extends greater than or less than one-half inch away from the first latitudinal edge 512 without departing from the scope and spirit of the exemplary embodiment. For example, the first flange 513 can extend a distance ranging from about one-fourth inch to about six inches away from the first latitudinal edge 512.

Similarly, the second flange 515 extends away from the second latitudinal edge 514 in substantially the same plane as the rear sidewall panel 510. The second flange 515 is integrally formed with the rear sidewall panel 510 substantially along the entire length of the second latitudinal edge 514. However, according to some alternative exemplary embodiments, the second flange 515 is independently formed from the rear sidewall panel 510 and thereafter coupled to the second latitudinal edge 514 of the rear sidewall panel 510. According to one exemplary embodiment, the second flange 515 extends a distance of about one-half inch away from the second latitudinal edge 514. However, according to other exemplary embodiments, the second flange 515 extends greater than or less than one-half inch away from the second latitudinal edge 514 without departing from the scope and spirit of the exemplary embodiment. For example, the second flange 515 can extend a distance ranging from about one-fourth inch to about six inches away from the second latitudinal edge 514.

The first sidewall panel 520 extends away from the first longitudinal edge 516 in substantially the same plane as the rear sidewall panel 510. The first sidewall panel 520 is integrally formed with the rear sidewall panel 510 substantially along the entire length of the first longitudinal edge 516. However, according to some alternative exemplary embodiments, the first sidewall panel 520 is independently formed from the rear sidewall panel 510 and thereafter coupled to the first longitudinal edge 516 of the rear sidewall panel 510.

The first sidewall panel 520 has a first latitudinal edge 522, a second latitudinal edge 524, a first longitudinal edge 526, and the commonly shared first longitudinal edge 516 of the rear sidewall panel 510. According to this exemplary embodiment, the length of the first latitudinal edge 522 is substantially equal to the length of the second latitudinal edge 524. Similarly, the length of the first longitudinal edge 526 is substantially equal to the length of the commonly shared first longitudinal edge 516 of the rear sidewall panel 510. However, in alternative exemplary embodiments, the lengths of the first latitudinal edge 522 and the second latitudinal edge 524 and/or the lengths of the first longitudinal edge 526 and the commonly shared first longitudinal edge 516 of the rear sidewall panel 510 can be different from one another. According to one exemplary embodiment, the lengths of the first latitudinal edge 522 and the second latitudinal edge 524 are about eight inches and the lengths of the first longitudinal edge 526 and the commonly shared first longitudinal edge 516 of the rear sidewall panel 510 are about nineteen inches. However, according to other exemplary embodiments, the lengths of the first latitudinal edge 522 and the second latitudinal edge 524 can be greater than or less than eight inches without departing from the scope and spirit of the exemplary embodiment. For example, the first sidewall panel 520 can extend a distance ranging from about one inch to about twelve feet away from the first longitudinal edge 516 of the rear sidewall panel 510. The lengths of the first latitudinal edge 522 and the second latitudinal edge 524 of the first sidewall panel 520 determines the length of the first chamfered corner 590 of the sidewall wrap 150.

The third flange 523 and the fourth flange 525 are similar to the first flange 513 and the second flange 515, respectively, except that the third flange 523 extends away from the first latitudinal edge 522 in substantially the same plane as the first sidewall panel 520 and the fourth flange 525 extends away from the second latitudinal edge 524 in substantially the same plane as the first sidewall panel 520.

The second sidewall panel 530 extends away from the first longitudinal edge 526 in substantially the same plane as the first sidewall panel 520. The second sidewall panel 530 is integrally formed with the first sidewall panel 520 substantially along the entire length of the first longitudinal edge 526. However, according to some alternative exemplary embodiments, the second sidewall panel 530 is independently formed from the first sidewall panel 520 and thereafter coupled to the first longitudinal edge 526 of the first sidewall panel 520.

The second sidewall panel 530 has a first latitudinal edge 532, a second latitudinal edge 534, a first longitudinal edge 536, and the commonly shared first longitudinal edge 526 of the first sidewall panel 520. According to this exemplary embodiment, the length of the first latitudinal edge 532 is substantially equal to the length of the second latitudinal edge 534. Similarly, the length of the first longitudinal edge 536 is substantially equal to the length of the commonly shared first longitudinal edge 526 of the first sidewall panel 520. However, in alternative exemplary embodiments, the lengths of the first latitudinal edge 532 and the second latitudinal edge 534 and/or the lengths of the first longitudinal edge 536 and the commonly shared first longitudinal edge 526 of the first sidewall panel 520 can be different from one another. According to one exemplary embodiment, the lengths of the first latitudinal edge 532 and the second latitudinal edge 534 are about seven inches and the lengths of the first longitudinal edge 536 and the commonly shared first longitudinal edge 526 of the first sidewall panel 520 are about nineteen inches. However, according to other exemplary embodiments, the lengths of the first latitudinal edge 532 and the second latitudinal edge 534 can be greater than or less than seven inches without departing from the scope and spirit of the exemplary embodiment. For example, the second sidewall panel 530 can extend a distance ranging from about one inch to about twelve feet away from the first longitudinal edge 526 of the first sidewall panel 520.

The fifth flange 533 and the sixth flange 535 are similar to the first flange 513 and the second flange 515, respectively, except that the fifth flange 533 extends away from the first latitudinal edge 532 in substantially the same plane as the second sidewall panel 530 and the sixth flange 535 extends away from the second latitudinal edge 534 in substantially the same plane as the second sidewall panel 530. The seventh flange 537 also is similar to the first flange 513 except that the seventh flange 537 extends away from the first longitudinal edge 536 in substantially the same plane as the second sidewall panel 530.

The third sidewall panel 540 extends away from the second longitudinal edge 518 in substantially the same plane as the rear sidewall panel 510. The third sidewall panel 540 is integrally formed with the rear sidewall panel 510 substantially along the entire length of the second longitudinal edge 518. However, according to some alternative exemplary embodiments, the third sidewall panel 540 is independently formed from the rear sidewall panel 510 and thereafter coupled to the second longitudinal edge 518 of the rear sidewall panel 510.

The third sidewall panel 540 has a first latitudinal edge 542, a second latitudinal edge 544, the commonly shared second longitudinal edge 518 of the rear sidewall panel 510, and a second longitudinal edge 548. According to this exemplary embodiment, the length of the first latitudinal edge 542 is substantially equal to the length of the second latitudinal edge 544. Similarly, the length of the second longitudinal edge 548 is substantially equal to the length of the commonly shared second longitudinal edge 518 of the rear sidewall panel 510. However, in alternative exemplary embodiments, the lengths of the first latitudinal edge 542 and the second latitudinal edge 544 and/or the lengths of the second longitudinal edge 548 and the commonly shared second longitudinal edge 518 of the rear sidewall panel 510 can be different from one another. According to one exemplary embodiment, the lengths of the first latitudinal edge 542 and the second latitudinal edge 544 are about eight inches and the lengths of the second longitudinal edge 548 and the commonly shared second longitudinal edge 518 of the rear sidewall panel 510 are about nineteen inches. However, according to other exemplary embodiments, the lengths of the first latitudinal edge 542 and the second latitudinal edge 544 can be greater than or less than eight inches without departing from the scope and spirit of the exemplary embodiment. For example, the third sidewall panel 540 can extend a distance ranging from about one inch to about twelve feet away from the second longitudinal edge 518 of the rear sidewall panel 510. The lengths of the first latitudinal edge 542 and the second latitudinal edge 544 of the third sidewall panel 540 determines the length of the second chamfered corner 592 of the sidewall wrap 150.

The eighth flange 543 and the ninth flange 545 are similar to the first flange 513 and the second flange 515, respectively, except that the eighth flange 543 extends away from the first latitudinal edge 542 in substantially the same plane as the third sidewall panel 540 and the ninth flange 545 extends away from the second latitudinal edge 544 in substantially the same plane as the third sidewall panel 540.

The fourth sidewall panel 550 extends away from the second longitudinal edge 548 in substantially the same plane as the third sidewall panel 540. The fourth sidewall panel 550 is integrally formed with the third sidewall panel 540 substantially along the entire length of the second longitudinal edge 548. However, according to some alternative exemplary embodiments, the fourth sidewall panel 550 is independently formed from the third sidewall panel 540 and thereafter coupled to the second longitudinal edge 548 of the third sidewall panel 540.

The fourth sidewall panel 550 has a first latitudinal edge 552, a second latitudinal edge 554, the commonly shared second longitudinal edge 548 of the third sidewall panel 540, and a second longitudinal edge 558. According to this exemplary embodiment, the length of the first latitudinal edge 552 is substantially equal to the length of the second latitudinal edge 554. Similarly, the length of the second longitudinal edge 558 is substantially equal to the length of the commonly shared second longitudinal edge 548 of the third sidewall panel 540. However, in alternative exemplary embodiments, the lengths of the first latitudinal edge 552 and the second latitudinal edge 554 and/or the lengths of the second longitudinal edge 558 and the commonly shared second longitudinal edge 548 of the third sidewall panel 540 can be different from one another. According to one exemplary embodiment, the lengths of the first latitudinal edge 552 and the second latitudinal edge 554 are about seven inches and the lengths of the second longitudinal edge 558 and the commonly shared second longitudinal edge 548 of the third sidewall panel 540 are about nineteen inches. However, according to other exemplary embodiments, the lengths of the first latitudinal edge 552 and the second latitudinal edge 554 can be greater than or less than seven inches without departing from the scope and spirit of the exemplary embodiment. For example, the fourth sidewall panel 550 can extend a distance ranging from about one inch to about twelve feet away from the second longitudinal edge 548 of the third sidewall panel 540.

The tenth flange 553 and the eleventh flange 555 are similar to the first flange 513 and the second flange 515, respectively, except that the tenth flange 553 extends away from the first latitudinal edge 552 in substantially the same plane as the fourth sidewall panel 550 and the eleventh flange 555 extends away from the second latitudinal edge 554 in substantially the same plane as the fourth sidewall panel 550. The twelfth flange 559 also is similar to the first flange 513 except that the twelfth flange 559 extends away from the second longitudinal edge 558 in substantially the same plane as the fourth sidewall panel 550.

According to this exemplary embodiment, the sidewall wrap sheet metal 500 is fabricated from any suitable material including, but not limited to, mild steels, stainless steels, metals, alloys, and polymers. The thickness of the material is about twelve gauge; however, the thickness of the material can be greater than or less than twelve gauge depending upon at least the weight of the tank assembly unit 120 once the transformer and dielectric fluid is placed within it and the material chosen to fabricate the tank assembly unit 120. Exemplary thicknesses of the sidewall wrap sheet metal 500 ranges from about sixteen gauge to about ten gauge; however, other thicknesses can be used to fabricate the sidewall wrap sheet metal 500.

To form the sidewall wrap 150, the first sidewall panel 520 is bent or positioned at about one hundred and thirty-five degrees with respect to the rear sidewall panel 510. Similarly, the second sidewall panel 530 also is bent or positioned at about one hundred and thirty-five degrees with respect to the first sidewall panel 520 such that the second sidewall panel 530 lies in a plane which is substantially perpendicular to the plane that the rear sidewall panel 510 lies. The third sidewall panel 540 is bent or positioned at about one hundred and thirty-five degrees with respect to the rear sidewall panel 510 such that the surface of the third sidewall panel 540 faces the surface of the first sidewall panel 520. Similarly, the fourth sidewall panel 550 also is bent or positioned at about one hundred and thirty-five degrees with respect to the third sidewall panel 540 such that the fourth sidewall panel 550 lies in a plane which is substantially perpendicular to the plane that the rear sidewall panel 510 lies. The seventh flange 537 is bent or positioned at about ninety degrees with respect to the second sidewall panel 530 and is oriented in a direction towards the fourth sidewall panel 550. Similarly, the twelfth flange 559 is bent or positioned at about ninety degrees with respect to the fourth sidewall panel 550 and is oriented in a direction towards the second sidewall panel 530. Although not illustrated in FIG. 5B, the remaining flanges 513, 515, 523, 525, 533, 535, 543, 545, 553, and 555 are bent or positioned at about ninety degrees with respect to their respective sidewall panels 510, 520, 530, 540, and 550 and is inwardly oriented towards the chamber 160. Many of these flanges 513, 515, 523, 525, 533, 535, 537, 543, 545, 553, 555, and 559 either provide support for the sidewall wrap 150 or provide support for the cover (not shown). The seventh flange 537 and the twelfth flange 559 are configured to be coupled to the front panel 130 substantially parallel to the first longitudinal edge 316 and the second longitudinal edge 318 in a leak resistant manner, for example, via welding. The second flange 515, fourth flange 525, the sixth flange 535, the ninth flange 545, and the eleventh flange 555 are configured to be coupled to the pedestal base 140 in a leak resistant manner, for example, via welding. The first flange 513, third flange 523, the fifth flange 533, the eighth flange 543, and the tenth flange 553 are configured to be coupled to the cover (not shown) in a leak resistant manner, for example, via welding. The first flange 513, third flange 523, the fifth flange 533, the eighth flange 543, and the tenth flange 553 provide a support for the cover. Although certain panels are bent or positioned at one hundred and thirty-five degrees with respect to an adjacent panel, alternate angles ranging from greater than zero degrees to less than 180 degrees can be used without departing from the scope and spirit of the exemplary embodiment.

To form the tank assembly unit 120, the front plate 130, the pedestal base 140, and the sidewall wrap 150 are oriented into a tank structure thereby forming chamber 160. The pedestal base 140 forms the bottom surface of the tank assembly unit 120. The front plate 130 is oriented such that it is perpendicular to the pedestal base panel 410. The sidewall wrap 150 is positioned on top of the pedestal base panel 410 and the second sidewall panel 530 and the fourth sidewall panel 550 are coupled to the front plate 130. The mating portions of the front plate 130, the pedestal base 140, and the sidewall wrap 150 are sealed together in a leak-resistant manner. One method for sealing these edges include, but is not limited to, welding. However, alternative methods known to persons of ordinary skill in the art can be used for forming a leak-resistant seal without departing from the scope and spirit of the exemplary embodiment. Once the tank assembly unit 120 is formed, the tank assembly unit 120 is disposed over opening 220A of the mounting pad 110 so that the pedestal base 140 completely covers the opening 220A. The front plate 130 is positioned on the divider 230. The pedestal base is coupled to the mounting pad 110 using mounting brackets (not shown) or any other devices known to persons having ordinary skill in the art.

As shown in FIGS. 1 and 5B, the chamfered corners 590 and 592 of the tank assembly unit 120 allow for less dielectric fluid to be used; thereby, decreasing the weight of the tank assembly unit 120. This decrease in weight allows for a decrease in manufacturing and operating costs due to a reduction of necessary tank support structures, a decrease in the amount of dielectric fluid used, and a decrease in installation difficulties due to a lighter tank assembly unit 120.

Although one exemplary embodiment of the tank assembly unit 120 having chamfered corners 190 and 192 has been illustrated and described, the sidewall wrap can be configured in various alternative geometric configurations. Additionally, although this exemplary embodiment depicts a surface of the pedestal base 140 to function as the bottom of the tank assembly unit 120, alternative exemplary embodiments can have a separate tank bottom support (not shown), similar to the tank bottom support described with respect to FIGS. 7A and 7B, without departing from the scope and spirit of the exemplary embodiment. Accordingly, this separate tank bottom support is coupled to the lower portions of the sidewall wrap 150 and the lower portion of the front plate 130 and is configured to rest on top of the pedestal base 140 once disposed over the opening 220A of the mounting pad 110.

Figure 6A:
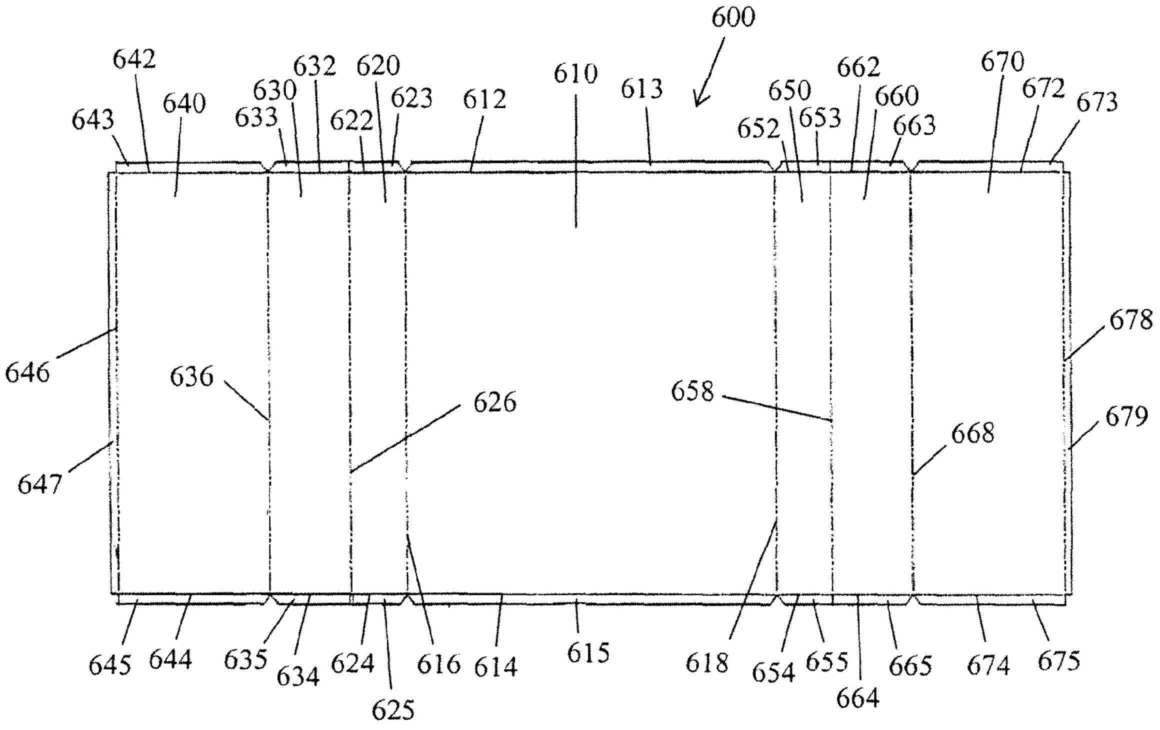
FIG. 6A is a side view of an alternate sidewall wrap metal sheet used to fabricate an alternate sidewall wrap in accordance with another exemplary embodiment.
Figure 6B:
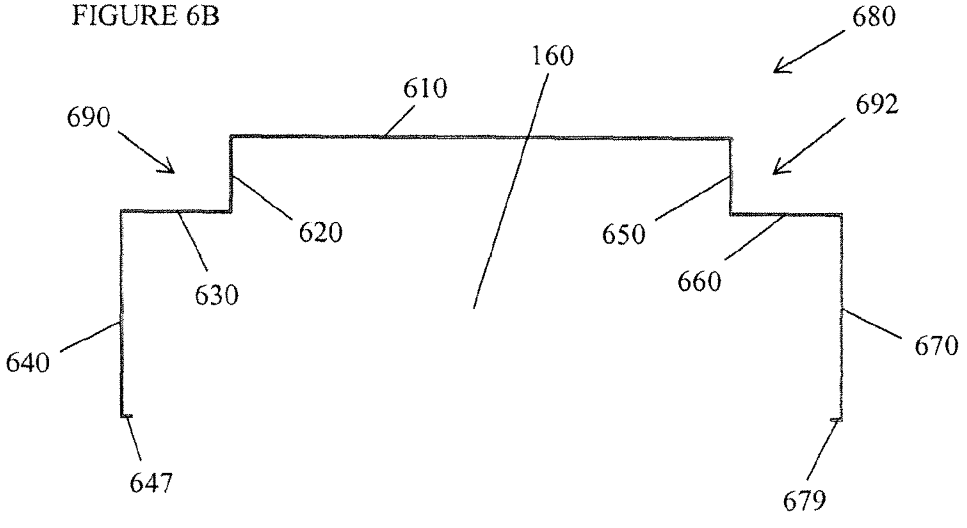
FIG. 6B is a top view of the alternative sidewall wrap fabricated from the alternative sidewall wrap metal sheet of FIG. 6A in accordance with another exemplary embodiment.

FIG. 6A is a side view of an alternate sidewall wrap metal sheet 600 used to fabricate an alternate sidewall wrap 680 in accordance with another exemplary embodiment. FIG. 6B is a top view of the alternative sidewall wrap 680 fabricated from the alternative sidewall wrap metal sheet 600 of FIG. 6A in accordance with another exemplary embodiment. Referring to FIGS. 1, 6A, and 6B, the alternate sidewall wrap metal sheet 600 includes seven sidewall panels, which are a rear sidewall panel 610, a first sidewall panel 520, a second sidewall panel 530, a third sidewall panel 540, a fourth sidewall panel 550, a fifth sidewall panel 560, and a sixth side wall panel 570. Additionally, according to some exemplary embodiments, the alternate sidewall wrap metal sheet 600 also includes a first flange 613, a second flange 615, a third flange 623, a fourth flange 625, a fifth flange 633, a sixth flange 635, a seventh flange 643, an eighth flange 645, a ninth flange 647, a tenth flange 653, an eleventh flange 655, a twelfth flange 663, a thirteenth flange 665, a fourteenth flange 673, a fifteenth flange 675, and a sixteenth flange 679. However, according to certain alternative exemplary embodiments, the number of flanges can be fewer without departing from the scope and spirit of the exemplary embodiment. In certain other alternative exemplary embodiments, the number of sidewall panels can be greater than or fewer than seven without departing from the scope and spirit of the exemplary embodiment. Alternatively, other exemplary embodiments can have sidewall wraps configured in various geometric shapes without departing from the scope and spirit of the exemplary embodiment.

The rear sidewall panel 610 has a first latitudinal edge 612, a second latitudinal edge 614, a first longitudinal edge 616, and a second longitudinal edge 618. According to this exemplary embodiment, the length of the first latitudinal edge 612 is substantially equal to the length of the second latitudinal edge 614. Similarly, the length of the first longitudinal edge 616 is substantially equal to the length of the second longitudinal edge 618. However, in alternative exemplary embodiments, the lengths of the first latitudinal edge 612 and the second latitudinal edge 614 and/or the lengths of the first longitudinal edge 616 and the second longitudinal edge 618 can be different from one another. According to one exemplary embodiment, the lengths of the first latitudinal edge 612 and the second latitudinal edge 614 are about twenty-three inches and the lengths of the first longitudinal edge 616 and the second longitudinal edge 618 are about nineteen inches. However, according to other exemplary embodiments, the lengths of the first latitudinal edge 612 and the second latitudinal edge 614 can be greater than or less than twenty-three inches, depending upon the requirements of the application, without departing from the scope and spirit of the exemplary embodiment. For example, the lengths of the first latitudinal edge 612 and the second latitudinal edge 614 can range from about six inches to about twelve feet. Similarly, according to other exemplary embodiments, the lengths of the first longitudinal edge 616 and the second longitudinal edge 618 can be greater than or less than nineteen inches, depending upon the requirements of the application, without departing from the scope and spirit of the exemplary embodiment. For example, the lengths of the first longitudinal edge 616 and the second longitudinal edge 618 can range from about six inches to about twelve feet.

The first flange 613 extends away from the first latitudinal edge 612 in substantially the same plane as the rear sidewall panel 610. The first flange 613 is integrally formed with the rear sidewall panel 610 substantially along the entire length of the first latitudinal edge 612. However, according to some alternative exemplary embodiments, the first flange 613 is independently formed from the rear sidewall panel 610 and thereafter coupled to the first latitudinal edge 612 of the rear sidewall panel 610. According to one exemplary embodiment, the first flange 613 extends a distance of about one-half inch away from the first latitudinal edge 612. However, according to other exemplary embodiments, the first flange 613 extends greater than or less than one-half inch away from the first latitudinal edge 612 without departing from the scope and spirit of the exemplary embodiment. For example, the first flange 613 can extend a distance ranging from about one-fourth inch to about six inches away from the first latitudinal edge 612.

Similarly, the second flange 615 extends away from the second latitudinal edge 614 in substantially the same plane as the rear sidewall panel 610. The second flange 615 is integrally formed with the rear sidewall panel 610 substantially along the entire length of the second latitudinal edge 614. However, according to some alternative exemplary embodiments, the second flange 615 is independently formed from the rear sidewall panel 610 and thereafter coupled to the second latitudinal edge 614 of the rear sidewall panel 610. According to one exemplary embodiment, the second flange 615 extends a distance of about one-half inch away from the second latitudinal edge 614. However, according to other exemplary embodiments, the second flange 615 extends greater than or less than one-half inch away from the second latitudinal edge 614 without departing from the scope and spirit of the exemplary embodiment. For example, the second flange 615 can extend a distance ranging from about one-fourth inch to about six inches away from the second latitudinal edge 614.

The first sidewall panel 620 extends away from the first longitudinal edge 616 in substantially the same plane as the rear sidewall panel 610. The first sidewall panel 620 is integrally formed with the rear sidewall panel 610 substantially along the entire length of the first longitudinal edge 616. However, according to some alternative exemplary embodiments, the first sidewall panel 620 is independently formed from the rear sidewall panel 610 and thereafter coupled to the first longitudinal edge 616 of the rear sidewall panel 610.

The first sidewall panel 620 has a first latitudinal edge 622, a second latitudinal edge 624, a first longitudinal edge 626, and the commonly shared first longitudinal edge 616 of the rear sidewall panel 610. According to this exemplary embodiment, the length of the first latitudinal edge 622 is substantially equal to the length of the second latitudinal edge 624. Similarly, the length of the first longitudinal edge 626 is substantially equal to the length of the commonly shared first longitudinal edge 616 of the rear sidewall panel 610. However, in alternative exemplary embodiments, the lengths of the first latitudinal edge 622 and the second latitudinal edge 624 and/or the lengths of the first longitudinal edge 626 and the commonly shared first longitudinal edge 616 of the rear sidewall panel 610 can be different from one another. According to one exemplary embodiment, the lengths of the first latitudinal edge 622 and the second latitudinal edge 624 are about three inches and the lengths of the first longitudinal edge 626 and the commonly shared first longitudinal edge 616 of the rear sidewall panel 610 are about nineteen inches. However, according to other exemplary embodiments, the lengths of the first latitudinal edge 622 and the second latitudinal edge 624 can be greater than or less than three inches without departing from the scope and spirit of the exemplary embodiment. For example, the first sidewall panel 620 can extend a distance ranging from about one-half inch to about twelve feet away from the first longitudinal edge 616 of the rear sidewall panel 610.

The third flange 623 and the fourth flange 625 are similar to the first flange 613 and the second flange 615, respectively, except that the third flange 623 extends away from the first latitudinal edge 622 in substantially the same plane as the first sidewall panel 620 and the fourth flange 625 extends away from the second latitudinal edge 624 in substantially the same plane as the first sidewall panel 620.

The second sidewall panel 630 extends away from the first longitudinal edge 626 in substantially the same plane as the first sidewall panel 620. The second sidewall panel 630 is integrally formed with the first sidewall panel 620 substantially along the entire length of the first longitudinal edge 626. However, according to some alternative exemplary embodiments, the second sidewall panel 630 is independently formed from the first sidewall panel 620 and thereafter coupled to the first longitudinal edge 626 of the first sidewall panel 620.

The second sidewall panel 630 has a first latitudinal edge 632, a second latitudinal edge 634, a first longitudinal edge 636, and the commonly shared first longitudinal edge 626 of the first sidewall panel 620. According to this exemplary embodiment, the length of the first latitudinal edge 632 is substantially equal to the length of the second latitudinal edge 634. Similarly, the length of the first longitudinal edge 636 is substantially equal to the length of the commonly shared first longitudinal edge 626 of the first sidewall panel 620. However, in alternative exemplary embodiments, the lengths of the first latitudinal edge 632 and the second latitudinal edge 634 and/or the lengths of the first longitudinal edge 636 and the commonly shared first longitudinal edge 626 of the first sidewall panel 620 can be different from one another. According to one exemplary embodiment, the lengths of the first latitudinal edge 632 and the second latitudinal edge 634 are about five inches and the lengths of the first longitudinal edge 636 and the commonly shared first longitudinal edge 626 of the first sidewall panel 620 are about nineteen inches. However, according to other exemplary embodiments, the lengths of the first latitudinal edge 632 and the second latitudinal edge 634 can be greater than or less than five inches without departing from the scope and spirit of the exemplary embodiment. For example, the second sidewall panel 630 can extend a distance ranging from about one inch to about twelve feet away from the first longitudinal edge 626 of the first sidewall panel 620.

The fifth flange 633 and the sixth flange 635 are similar to the first flange 613 and the second flange 615, respectively, except that the fifth flange 633 extends away from the first latitudinal edge 632 in substantially the same plane as the second sidewall panel 630 and the sixth flange 635 extends away from the second latitudinal edge 634 in substantially the same plane as the second sidewall panel 630.

The third sidewall panel 640 extends away from the first longitudinal edge 636 in substantially the same plane as the second sidewall panel 630. The third sidewall panel 640 is integrally formed with the second sidewall panel 630 substantially along the entire length of the first longitudinal edge 636. However, according to some alternative exemplary embodiments, the third sidewall panel 640 is independently formed from the second sidewall panel 630 and thereafter coupled to the first longitudinal edge 636 of the second sidewall panel 630.

The third sidewall panel 640 has a first latitudinal edge 642, a second latitudinal edge 644, a first longitudinal edge 646, and the commonly shared first longitudinal edge 636 of the second sidewall panel 630. According to this exemplary embodiment, the length of the first latitudinal edge 642 is substantially equal to the length of the second latitudinal edge 644. Similarly, the length of the first longitudinal edge 646 is substantially equal to the length of the commonly shared first longitudinal edge 636 of the second sidewall panel 630. However, in alternative exemplary embodiments, the lengths of the first latitudinal edge 642 and the second latitudinal edge 644 and/or the lengths of the first longitudinal edge 646 and the commonly shared first longitudinal edge 636 of the second sidewall panel 630 can be different from one another. According to one exemplary embodiment, the lengths of the first latitudinal edge 642 and the second latitudinal edge 644 are about nine inches and the lengths of the first longitudinal edge 646 and the commonly shared first longitudinal edge 636 of the second sidewall panel 630 are about nineteen inches. However, according to other exemplary embodiments, the lengths of the first latitudinal edge 642 and the second latitudinal edge 644 can be greater than or less than nine inches without departing from the scope and spirit of the exemplary embodiment. For example, the third sidewall panel 640 can extend a distance ranging from about one inch to about twelve feet away from the first longitudinal edge 636 of the second sidewall panel 630.

The seventh flange 643 and the eighth flange 645 are similar to the first flange 513 and the second flange 515, respectively, except that the seventh flange 643 extends away from the first latitudinal edge 642 in substantially the same plane as the third sidewall panel 640 and the eighth flange 645 extends away from the second latitudinal edge 644 in substantially the same plane as the third sidewall panel 640. The ninth flange 647 also is similar to the first flange 513 except that the ninth flange 647 extends away from the first longitudinal edge 646 in substantially the same plane as the third sidewall panel 640.

The fourth sidewall panel 650 extends away from the second longitudinal edge 618 in substantially the same plane as the rear sidewall panel 610. The fourth sidewall panel 650 is integrally formed with the rear sidewall panel 610 substantially along the entire length of the second longitudinal edge 618. However, according to some alternative exemplary embodiments, the fourth sidewall panel 650 is independently formed from the rear sidewall panel 610 and thereafter coupled to the second longitudinal edge 618 of the rear sidewall panel 610.

The fourth sidewall panel 650 has a first latitudinal edge 652, a second latitudinal edge 654, the commonly shared second longitudinal edge 618 of the rear sidewall panel 610, and a second longitudinal edge 658. According to this exemplary embodiment, the length of the first latitudinal edge 652 is substantially equal to the length of the second latitudinal edge 654. Similarly, the length of the second longitudinal edge 658 is substantially equal to the length of the commonly shared second longitudinal edge 618 of the rear sidewall panel 610. However, in alternative exemplary embodiments, the lengths of the first latitudinal edge 652 and the second latitudinal edge 654 and/or the lengths of the second longitudinal edge 658 and the commonly shared second longitudinal edge 618 of the rear sidewall panel 610 can be different from one another. According to one exemplary embodiment, the lengths of the first latitudinal edge 652 and the second latitudinal edge 654 are about three inches and the lengths of the second longitudinal edge 658 and the commonly shared second longitudinal edge 618 of the rear sidewall panel 610 are about nineteen inches. However, according to other exemplary embodiments, the lengths of the first latitudinal edge 652 and the second latitudinal edge 654 can be greater than or less than three inches without departing from the scope and spirit of the exemplary embodiment. For example, the fourth sidewall panel 650 can extend a distance ranging from about one-half inch to about twelve feet away from the second longitudinal edge 618 of the rear sidewall panel 610.

The tenth flange 653 and the eleventh flange 655 are similar to the first flange 513 and the second flange 515, respectively, except that the tenth flange 653 extends away from the first latitudinal edge 652 in substantially the same plane as the fourth sidewall panel 650 and the eleventh flange 655 extends away from the second latitudinal edge 654 in substantially the same plane as the fourth sidewall panel 650.

The fifth sidewall panel 660 extends away from the second longitudinal edge 658 in substantially the same plane as the fourth sidewall panel 650. The fifth sidewall panel 660 is integrally formed with the fourth sidewall panel 650 substantially along the entire length of the second longitudinal edge 658. However, according to some alternative exemplary embodiments, the fifth sidewall panel 660 is independently formed from the fourth sidewall panel 650 and thereafter coupled to the second longitudinal edge 658 of the fourth sidewall panel 650.

The fifth sidewall panel 660 has a first latitudinal edge 662, a second latitudinal edge 664, the commonly shared second longitudinal edge 658 of the fourth sidewall panel 650, and a second longitudinal edge 668. According to this exemplary embodiment, the length of the first latitudinal edge 662 is substantially equal to the length of the second latitudinal edge 664. Similarly, the length of the second longitudinal edge 668 is substantially equal to the length of the commonly shared second longitudinal edge 658 of the fourth sidewall panel 650. However, in alternative exemplary embodiments, the lengths of the first latitudinal edge 662 and the second latitudinal edge 664 and/or the lengths of the second longitudinal edge 668 and the commonly shared second longitudinal edge

658 of the fourth sidewall panel 650 can be different from one another. According to one exemplary embodiment, the lengths of the first latitudinal edge 662 and the second latitudinal edge 664 are about five inches and the lengths of the second longitudinal edge 668 and the commonly shared second longitudinal edge 658 of the fourth sidewall panel 650 are about nineteen inches. However, according to other exemplary embodiments, the lengths of the first latitudinal edge 662 and the second latitudinal edge 664 can be greater than or less than five inches without departing from the scope and spirit of the exemplary embodiment. For example, the fifth sidewall panel 660 can extend a distance ranging from about one-half inch to about twelve feet away from the second longitudinal edge 658 of the fourth sidewall panel 650.

The twelfth flange 663 and the thirteenth flange 665 are similar to the first flange 513 and the second flange 515, respectively, except that the twelfth flange 663 extends away from the first latitudinal edge 662 in substantially the same plane as the fifth sidewall panel 660 and the thirteenth flange 665 extends away from the second latitudinal edge 664 in substantially the same plane as the fifth sidewall panel 660.

The sixth sidewall panel 670 extends away from the second longitudinal edge 668 in substantially the same plane as the fifth sidewall panel 660. The sixth sidewall panel 670 is integrally formed with the fifth sidewall panel 660 substantially along the entire length of the second longitudinal edge 668. However, according to some alternative exemplary embodiments, the sixth sidewall panel 670 is independently formed from the fifth sidewall panel 660 and thereafter coupled to the second longitudinal edge 668 of the fifth sidewall panel 660.

The sixth sidewall panel 670 has a first latitudinal edge 672, a second latitudinal edge 674, the commonly shared second longitudinal edge 668 of the fifth sidewall panel 660, and a second longitudinal edge 678. According to this exemplary embodiment, the length of the first latitudinal edge 672 is substantially equal to the length of the second latitudinal edge 674. Similarly, the length of the second longitudinal edge 678 is substantially equal to the length of the commonly shared second longitudinal edge 668 of the fifth sidewall panel 660. However, in alternative exemplary embodiments, the lengths of the first latitudinal edge 672 and the second latitudinal edge 674 and/or the lengths of the second longitudinal edge 678 and the commonly shared second longitudinal edge 668 of the fifth sidewall panel 660 can be different from one another. According to one exemplary embodiment, the lengths of the first latitudinal edge 672 and the second latitudinal edge 674 are about nine inches and the lengths of the second longitudinal edge 678 and the commonly shared second longitudinal edge 668 of the fifth sidewall panel 660 are about nineteen inches. However, according to other exemplary embodiments, the lengths of the first latitudinal edge 672 and the second latitudinal edge 674 can be greater than or less than nine inches without departing from the scope and spirit of the exemplary embodiment. For example, the sixth sidewall panel 670 can extend a distance ranging from about one inch to about twelve feet away from the second longitudinal edge 668 of the fifth sidewall panel 660.

The fourteenth flange 673 and the fifteenth flange 675 are similar to the first flange 513 and the second flange 515, respectively, except that the fourteenth flange 673 extends away from the first latitudinal edge 672 in substantially the same plane as the sixth sidewall panel 670 and the fifteenth flange 675 extends away from the second latitudinal edge 674 in substantially the same plane as the sixth sidewall panel 670. The sixteenth flange 679 also is similar to the first flange 513 except that the sixteenth flange 679 extends away from the second longitudinal edge 678 in substantially the same plane as the sixth sidewall panel 670.

According to this exemplary embodiment, the alternative sidewall wrap sheet metal 600 is fabricated from any suitable material including, but not limited to, mild steels, stainless steels, metals, alloys, and polymers. The thickness of the material is about twelve gauge; however, the thickness of the material can be greater than or less than twelve gauge depending upon at least the weight of the tank assembly unit 120 once the transformer and dielectric fluid is placed within it and the material chosen to fabricate the tank assembly unit 120. Exemplary thicknesses of the alternative sidewall wrap sheet metal 600 ranges from about sixteen gauge to about ten gauge; however, other thicknesses can be used to fabricate the alternative sidewall wrap sheet metal 600.

To form the alternative sidewall wrap 680, the first sidewall panel 620 is bent or positioned at about ninety degrees with respect to the rear sidewall panel 610. Similarly, the second sidewall panel 630 also is bent or positioned at about ninety degrees with respect to the first sidewall panel 620 such that the second sidewall panel 630 lies in a plane that is substantially parallel to the plane that the rear sidewall panel 610 lies, except that the second sidewall panel 630 does not face the rear sidewall panel 610. The third sidewall panel 640 is bent or positioned at about ninety degrees with respect to the second sidewall panel 630 such that the third sidewall panel 640 lies in a plane that is substantially parallel to the plane that the first sidewall panel 620 lies, except that the third sidewall panel 640 does not face the first sidewall panel 620. Similarly, the fourth sidewall panel 650 is bent or positioned at about ninety degrees with respect to the rear sidewall panel 610 such that the fourth sidewall panel 650 faces the first sidewall panel 620. The fifth sidewall panel 660 also is bent or positioned at about ninety degrees with respect to the fourth sidewall panel 650 such that the fifth sidewall panel 660 lies in a plane that is substantially parallel to the plane that the rear sidewall panel 610 lies, except that the fifth sidewall panel 660 does not face the rear sidewall panel 610. The sixth sidewall panel 670 is bent or positioned at about ninety degrees with respect to the fifth sidewall panel 660 such that the sixth sidewall panel 670 lies in a plane that is substantially parallel to the plane that the fourth sidewall panel 650 lies, except that the sixth sidewall panel 670 does not face the fourth sidewall panel 650. The ninth flange 647 is bent or positioned at about ninety degrees with respect to the third sidewall panel 640 and is oriented in a direction towards the sixth sidewall panel 670. Similarly, the sixteenth flange 679 is bent or positioned at about ninety degrees with respect to the sixth sidewall panel 670 and is oriented in a direction towards the third sidewall panel 640. Although not illustrated in FIG. 6B, the remaining flanges 613, 615, 623, 625, 633, 635, 643, 645, 653, 655, 663, 665, 673, and 675 are bent or positioned at about ninety degrees with respect to their respective sidewall panels 610, 620, 630, 640, 650, 660, and 670 and is inwardly oriented towards the chamber 160. Many of these flanges 613, 615, 623, 625, 633, 635, 643, 645, 647, 653, 655, 663, 665, 673, 675, and 679 either provide support for the sidewall wrap 680 or provide support for the cover (not shown). Although certain panels are bent or positioned at ninety degrees with respect to an adjacent panel, alternate angles ranging from greater than zero degrees to less than 180 degrees can be used without departing from the scope and spirit of the exemplary embodiment.

The alternative sidewall wrap 680 can be coupled to the front plate 130 and the pedestal base 140 to form an alternative tank assembly unit. As shown in FIG. 6B, the inverted corners 690 and 692 of the alternative sidewall wrap 680 allow for less dielectric fluid to be used; thereby, decreasing the weight of the alternative tank assembly unit (not shown). This decrease in weight also allows for a decrease in manufacturing and operating costs due to a reduction of necessary tank support structures, a decrease in the amount of dielectric fluid used, and a decrease in installation difficulties due to a lighter alternative tank assembly unit.

Figure 7A:
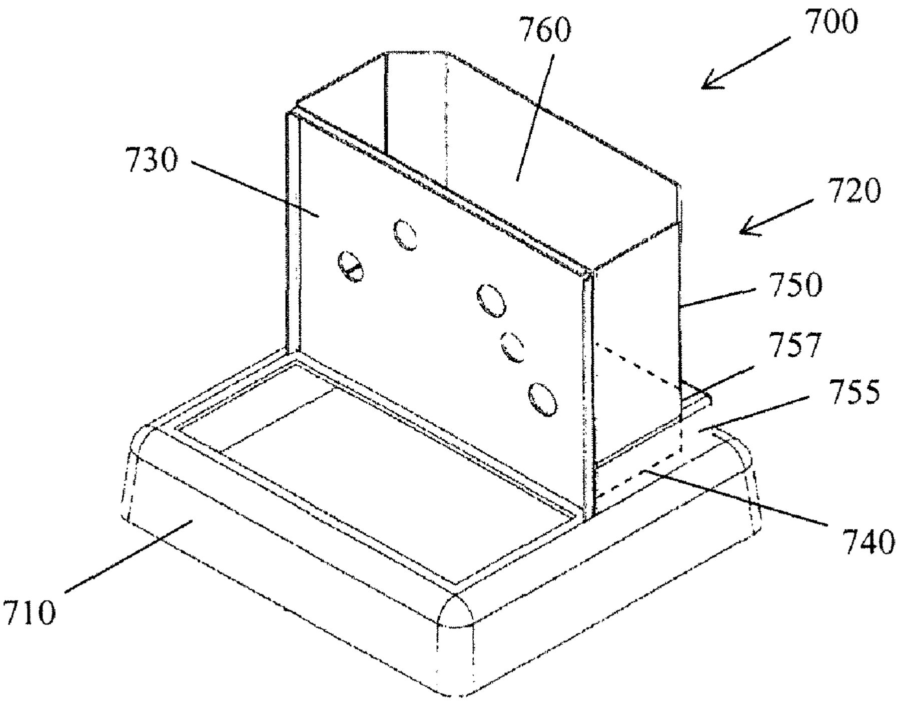
FIG. 7A is a perspective view of another alternative pad mounted tank assembly unit in accordance with yet another exemplary embodiment.
Figure 7B:
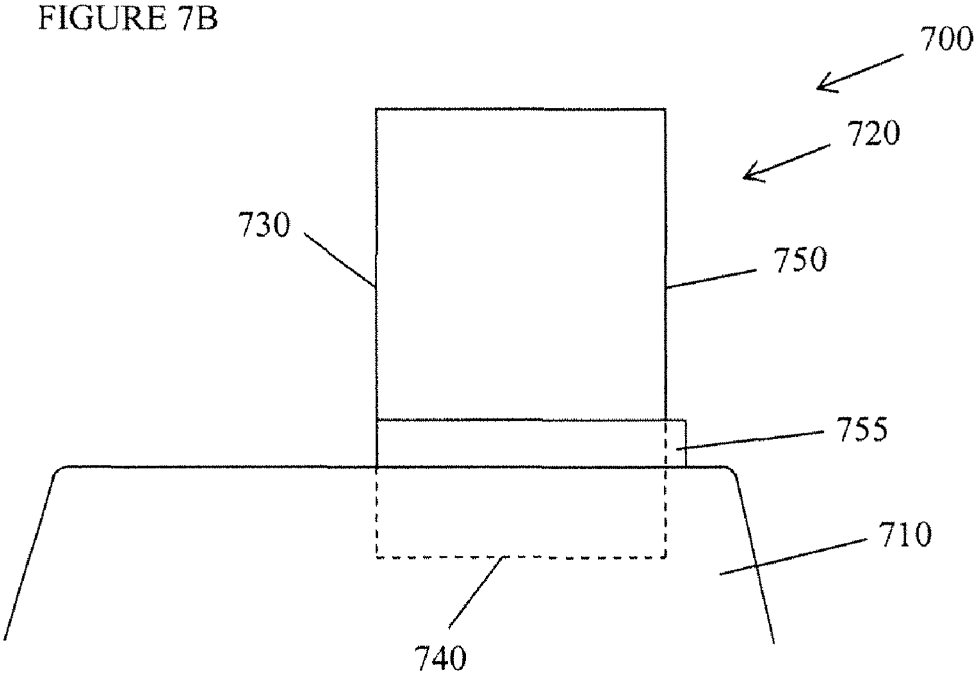
FIG. 7B is a side view of the alternative pad mounted tank assembly unit of FIG. 7A in accordance with yet another exemplary embodiment.

FIG. 7A is a perspective view of another alternative pad mounted tank assembly unit 700 in accordance with yet another exemplary embodiment. FIG. 7B is a side view of the alternative pad mounted tank assembly unit 700 of FIG. 7A in accordance with yet another exemplary embodiment. Referring to FIGS. 7A and 7B, the alternate pad mounted tank assembly unit 700 includes a mounting pad 710 and a tank assembly unit 720 coupled to the mounting pad 710. According to one exemplary embodiment, the tank assembly unit 720 is disposed over an opening (not shown) formed within the mounting pad 710. The tank assembly unit 720 is configured to completely cover the opening (not shown) of the mounting pad 710 so that gaps are not formed between the tank assembly unit 720 and the opening (not shown).

The tank assembly unit 720 includes a front plate 730, a tank bottom support 740, a sidewall wrap 750, a pedestal base 755, and a cover (not shown). The front plate 130, the tank bottom support 740, the sidewall wrap 750, and the cover are coupled together and configured to form a chamber 760 within the tank assembly unit 720. The pedestal base 755 has an aperture 757 configured to receive a portion of the sidewall wrap 750 so that a portion of the sidewall wrap 750 is inserted through the pedestal base 755. The aperture 757 is shaped according to the shape of the sidewall wrap 750 so that gaps are not formed between the aperture 757 and the sidewall wrap 750. The pedestal base 755 also is coupled to the front plate 130, the tank bottom support 740, and the sidewall wrap 750 to form the tank assembly unit 720.

This configuration allows the pedestal base 755 to completely cover the opening of the mounting pad 710 so that gaps are not formed between the opening of the mounting pad 710 and the tank assembly unit 720. Additionally, this configuration allows for more dielectric fluid to be used within the chamber 760, yet minimize the total height or profile of the alternative pad mounted tank assembly unit 700.

The alternative pad mounted tank assembly unit 700 is similar to the pad mounted tank assembly unit 100 of FIG. 1, except that the alternative pad mounted tank assembly unit 700 has a separate tank bottom support 740, instead of using a surface of the pedestal base 755 as the tank assembly unit's 720 bottom. Another difference is that the pedestal base 755 includes the aperture 757 so that a portion of the sidewall wrap 750 can be inserted through the aperture 757, thereby minimizing the overall height or profile of the alternative pad mounted tank assembly unit 700. The alternative pad mounted tank assembly unit 700 can be similarly modified according to the description provided for the pad mounted tank assembly unit 100 of FIG. 1.

Although each exemplary embodiment has been described in detail, it is to be construed that any features and modifications that are applicable to one embodiment are also applicable to the other embodiments.

Although the invention has been described with reference to specific embodiments, these descriptions are not meant to be construed in a limiting sense. Various modifications of the disclosed embodiments, as well as alternative embodiments of the invention will become apparent to persons of ordinary skill in the art upon reference to the description of the exemplary embodiments. It should be appreciated by those of ordinary skill in the art that the conception and the specific embodiments disclosed may be readily utilized as a basis for modifying or designing other structures or methods for carrying out the same purposes of the invention. It should also be realized by those of ordinary skill in the art that such equivalent constructions do not depart from the spirit and scope of the invention as set forth in the appended claims. It is therefore, contemplated that the claims will cover any such modifications or embodiments that fall within the scope of the invention.

What is claimed is:

1. A tank mountable to a mounting pad having at least one opening formed therein, the tank comprising:

a front plate;

at least one sidewall panel, wherein a first edge of one of the sidewall panel and a second edge of one of the sidewall panel are coupled to the front plate;

a pedestal base coupled to the front plate and the lower portions of the at least one sidewall panel; and a cover coupled to the upper portions of the at least one sidewall panel, wherein the at least one sidewall panel is configured into a first shape that forms a gap between an opening of a mounting pad and the at least one sidewall panel when the lower portions of the at least one sidewall panel are positioned adjacently on top of the opening of the mounting pad and when a portion of the perimeter of the at least one sidewall panel is disposed within the profile of the opening, the gap being formed within the profile of the opening, wherein the pedestal base is configured into a second shape where the outer profile of the coupled pedestal base and the front plate completely covers the opening of the mounting pad when disposed over the opening, and wherein the tank is configured to be filled with dielectric fluid.

2. The tank of claim 1, further comprising a tank bottom support coupled to the lower edges of the at least one sidewall panel such that the at least one sidewall panel extends in an upward direction from the tank bottom support, the tank bottom support, the front plate, the at least one sidewall panel, and the cover defining a tank chamber.

3. The tank of claim 2, wherein the pedestal base has an aperture for receiving the tank bottom support and a portion of the at least one sidewall panel is inserted through the aperture.

4. The tank of claim 2, wherein the pedestal base is substantially planar.

5. The tank of claim 2, wherein the pedestal base has a height ranging from about one-fourth inch to about twelve inches.

6. The tank of claim 2, wherein the at least one sidewall panel is configured to form at least one corner on the tank, the at least one corner selected from the group consisting of a chamfered corner, an inverted corner, and a rounded corner.

7. The tank of claim 2, wherein the at least one sidewall panel is a plurality of sidewall panels that are integrally formed.

8. The tank of claim 1, wherein the pedestal base is coupled to the lower edges of the at least one sidewall panel such that the at least one sidewall panel extends in an upward direction from the pedestal base, the pedestal base defining the bottom of the tank, and the pedestal base, the front plate, the at least one sidewall panel, and the cover defining a tank chamber.

9. The tank of claim 1, wherein the pedestal base is substantially planar.

10. The tank of claim 1, wherein the pedestal base has a height ranging from about one-fourth inch to about twelve inches.

11. The tank of claim 1, wherein the at least one sidewall panel is configured to form at least one corner on the tank, the at least one corner selected from the group consisting of a chamfered corner, an inverted corner, and a rounded corner.

12. The tank of claim 1, wherein the at least one sidewall panel is a plurality of sidewall panels that are integrally formed.

13. A pad mounted tank assembly unit, comprising:

a mounting pad comprising an opening; and a tank coupled to the mounting pad and completely covering the opening of the mounting pad when disposed over the opening, wherein the tank comprises:

a front plate;

at least one sidewall panel, wherein a first edge of one of the sidewall panel and a second edge of one of the sidewall panel are coupled to the front plate;

a pedestal base coupled to the front plate and the lower portions of the at least one sidewall panel; and a cover coupled to the upper portions of the at least one sidewall panel, wherein the at least one sidewall panel is configured into a first shape that forms a gap between an opening of a mounting pad and the at least one sidewall panel when the lower portions of the at least one sidewall panel are positioned adjacently on top of the opening of the mounting pad and when a portion of the perimeter of the at least one sidewall panel is disposed within the profile of the opening, the gap being formed within the profile of the opening, wherein the pedestal base is configured into a second shape wherein the outer profile of the coupled pedestal base and the front plate completely covers the opening of the mounting pad when disposed over the opening, and wherein the tank is configured to be filled with dielectric fluid.

14. The pad mounted tank assembly unit of claim 13, wherein the tank further comprises a tank bottom support coupled to the lower edges of the at least one sidewall panel such that the at least one sidewall panel extends in an upward direction from the tank bottom support, the tank bottom support, the front plate, the at least one sidewall panel, and the cover defining a tank chamber.

15. The pad mounted tank assembly unit of claim 14, wherein the pedestal base has an aperture for receiving the tank bottom support and a portion of the at least one sidewall panel is inserted through the aperture.

16. The pad mounted tank assembly unit of claim 13, wherein the pedestal base is coupled to the lower edges of the at least one sidewall panel such that the at least one sidewall panel extends in an upward direction from the pedestal base, the pedestal base defining the bottom of the tank, and the pedestal base, the front plate, the at least one sidewall panel, and the cover defining a tank chamber.

17. The pad mounted tank assembly unit of claim 13, wherein the pedestal base is substantially planar.

18. The pad mounted tank assembly unit of claim 13, wherein the pedestal base has a height ranging from about one-fourth inch to about twelve inches.

19. The pad mounted tank assembly unit of claim 13, wherein the at least one sidewall panel is configured to form at least one corner on the tank, the at least one corner selected from the group consisting of a chamfered corner, an inverted corner, and a rounded corner.

20. The pad mounted tank assembly unit of claim 17, wherein the at least one sidewall panel is a plurality of sidewall panels that are integrally formed.

21. The pad mounted tank assembly unit of claim 13, further comprising:

an electrical device; and the dielectric fluid surrounding the electrical device, wherein the tank encloses the electrical device and the dielectric fluid.

* * * * *